United States Patent
Omi et al.

(12) 
(10) Patent No.: US 6,436,226 B1
(45) Date of Patent: Aug. 20, 2002

(54) OBJECT SEPARATING APPARATUS AND METHOD, AND METHOD OF MANUFACTURING SEMICONDUCTOR SUBSTRATE

(75) Inventors: Kazuaki Omi, Yokohama; Takao Yonehara, Atsugi; Kiyofumi Sakaguchi; Kazutaka Yanagita, both of Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/211,876

(22) Filed: Dec. 15, 1998

(30) Foreign Application Priority Data

Dec. 26, 1997 (JP) ................................................ 9-361014

(51) Int. Cl.⁷ ...................... B32B 35/00; H01L 21/4763
(52) U.S. Cl. ........................ 156/344; 156/584; 156/239; 156/529; 438/458; 83/177; 29/426.4
(58) Field of Search .................................. 156/239, 344, 156/529, 584, 285, 353; 83/177; 29/426.4, 426.5, 762; 438/455, 458; 269/21

(56) References Cited

U.S. PATENT DOCUMENTS

| 4,507,898 A | * | 4/1985 | Hofer ........................... 451/75 |
| 4,702,042 A | * | 10/1987 | Herrington et al. ........... 451/40 |
| 4,703,591 A | * | 11/1987 | Herrington et al. ........... 451/40 |
| 4,962,879 A | | 10/1990 | Goesele et al. |
| 5,212,451 A | | 5/1993 | Frank et al. |
| 5,339,715 A | * | 8/1994 | Coleman .................... 83/177 X |
| 5,371,037 A | | 12/1994 | Yonehara |
| 5,374,564 A | | 12/1994 | Bruel |
| 5,783,022 A | * | 7/1998 | Cha et al. .................... 156/344 |
| 5,856,229 A | | 1/1999 | Sakaguchiu et al. |
| 5,863,830 A | | 1/1999 | Bruel et al. |
| 5,994,207 A | * | 11/1999 | Henley et al. ............... 438/515 |

FOREIGN PATENT DOCUMENTS

| FR | 2 699 852 | * | 7/1994 |
| JP | 9-167724 | * | 6/1997 |

OTHER PUBLICATIONS

European Search Report, dated Apr. 27, 1999.*

* cited by examiner

*Primary Examiner*—Mark A. Osele
(74) *Attorney, Agent, or Firm*—Morgan & Finnegan LLP

(57) ABSTRACT

An apparatus for separating a substrate having a porous layer at the porous layer is provided. A bonded substrate stack (101) having a porous layer (101*b*) is supported by substrate holding portions (108, 109) while being rotated. High-speed, high-pressure water (jet) is ejected from a nozzle (112) and injected against the bonded substrate stack (101), thereby physically separating the bonded substrate stack (101) into two substrates. The jet pressure is appropriately changed in accordance with progress of separation processing.

30 Claims, 13 Drawing Sheets

OBJECT SEPARATING APPARATUS AND METHOD, AND METHOD OF MANUFACTURING SEMICONDUCTOR SUBSTRATE

BACKGROUND OF THE INVENTION

1. Field of the Invention

The present invention relates to an object separating apparatus and method, and a method of manufacturing a semiconductor substrate.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.
(2) The radiation resistance can be increased.
(3) The operating speed of the device can be increased because the stray capacicance is small.
(4) No well step is necessary.
(5) Latch-up can be prevented.
(6) A completely depleted field-effect transistor can be formed by thin film formation.

Since an SOI structure has the above various advantages, researches have been made on its formation method for several decades.

As one SOI technology, an SOS (Silicon On Sapphire) technology by which Si is heteroepitaxially grown on a single-crystal sapphire substrate by CVD (Chemical Vapor Deposition) has been known for a long time. This SOS technology was once recognized as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

Various SOI technology appeared following the SOS technology. For these SOI technologies, various methods have been examined aiming at reducing crystal defects or manufacturing cost. There are a method of implanting oxygen ions into a substrate to form a buried oxide layer, a method of bonding two wafers via an oxide film and polishing or etching one of the wafers to leave a thin single-crystal Si layer on the oxide film, and a method of implanting hydrogen ions to a predetermined depth from the surface of an Si substrate having an oxide film, bonding the Si substrate to the other substrate, and peeling the latter substrate (the other substrate) by a heat treatment while leaving a thin single-crystal Si layer on the oxide film.

The present applicant has disclosed a new SOI technology in Japanese Patent Laid-Open No. 5-21338. In this technology, a first substrate obtained by forming a non-porous single-crystal layer on a single-crystal semiconductor substrate having a porous layer is bonded to a second substrate via an insulating layer ($SiO_2$), and the two substrates are separated from the porous layer to transfer the non-porous single-crystal layer to the second substrate. This technology is advantageous in that the SOI layer has high film thickness uniformity, the crystal defect density in the SOI layer can be decreased, the SOI layer has high surface planarity, no expensive special fabrication apparatus is necessary, and SOI substrates having SOI films about a few hundred Å to 10 $\mu$m thick can be fabricated by the same fabrication apparatus.

In addition, the present applicant has disclosed another technology in Japanese Patent Laid-Open No. 7-302889 in which, after the first and second substrates described above are bonded, the first substrate is separated from the second substrate without breaking, and the separated first substrate is reused by smoothening the surface and again forming a porous layer. Since the first substrate can be economically used, this technology has the advantages that the fabrication cost can be largely reduced and the fabrication process is also simple.

In the above technologies, however, when the two bonded substrates are separated it is necessary to prevent damages to the substrates and protect the fabrication apparatus and the like from contamination caused by the generation of particles.

SUMMARY OF THE INVENTION

The present invention has been made in consideration of the above situation, and has as its object to apply a separating apparatus and method suitable to separate semiconductor substrates or other objects, and a method of manufacturing a semiconductor substrate.

According to the present invention, there is provided a separating apparatus characterized by comprising jet means having a fluid jet unit for ejecting a jet of fluid to an object to be separated to separate the object, and control means for changing a condition for ejecting the fluid from the jet unit in accordance with progress of object separation processing.

The separating apparatus preferably further comprises a holding portion for holding the object to be separated.

In the separating apparatus, preferably, the object to be separated has a plate shape, and the holding portion holds the plate-like object to inject the fluid against the plate-like object in a planar direction thereof.

In the separating apparatus, the control means preferably changes a pressure of the fluid to be ejected from the jet unit in accordance with progress of object separation processing.

In the separating apparatus, the control means preferably controls the jet means to set the pressure of the fluid to be relatively high in separating a vicinity of a peripheral portion of a separation surface of the object to be separated.

In the separating apparatus, the control means preferably controls the jet means to set the pressure of the fluid to be relatively high in separating a vicinity of a central portion of a separation surface of the object to be separated.

In the separating apparatus, the control means preferably controls the jet means to set the pressure of the fluid to be relatively high in separating vicinities of peripheral and central portions of a separation surface of the object to be separated and controls the jet means to set the pressure of the fluid to be relatively low in separating an intermediate portion between the vicinities of the peripheral and the central portions.

In the separating apparatus, the control means preferably changes the condition for ejecting the fluid from the jet unit in accordance with a relative positional relationship between the jet unit and the object to be separated.

In the separating apparatus, the control means preferably changes the condition for ejecting the fluid from the jet unit as a function of time.

The separating apparatus preferably further comprises scanning means for scanning the jet unit.

The separating apparatus preferably further comprises rotating means for rotating the object about an axis perpendicular to a separation surface of the object to be separated.

The object to be separated preferably has a fragile layer as a separation layer. The fragile layer is preferably a porous layer or a layer having a microcavity.

According to the present invention, there is provided a separating method of separating an object by ejecting a jet of fluid from a jet unit to the object to be separated, characterized by comprising the control step of changing a condition for ejecting the fluid from the jet unit in accordance with progress of object separation processing.

In the separating method, preferably, the object to be separated has a plate shape and is separated by injecting the fluid against the plate-like object in a planar direction thereof.

In the separating method, the control step preferably comprises changing a pressure of the fluid to be ejected from the jet unit in accordance with progress of object separation processing.

In the separating method, the control step preferably comprises setting the pressure of the fluid to be ejected from the jet unit to be relatively high in separating a vicinity of a peripheral portion of a separation surface of the object to be separated.

In the separating method, the control step preferably comprises setting the pressure of the fluid to be ejected from the jet unit to be relatively high in separating a vicinity of a central portion of a separation surface of the object to be separated.

In the separating method, the control step preferably comprises setting the pressure of the fluid to be ejected from the jet unit to be relatively high in separating vicinities of peripheral and central portions of a separation surface of the object to be separated and setting the pressure of the fluid to be ejected from the jet unit to be relatively low in separating an intermediate portion between the vicinities of the peripheral and the central portions.

In the separating method, the control step preferably comprises changing the condition for ejecting the fluid from the jet unit in accordance with a relative positional relationship between the jet unit and the object to be separated.

In the separating method, the control step preferably comprises changing the condition for ejecting the fluid from the jet unit as a function of time.

The separating method preferably further comprises executing separation processing for the object while scanning the jet unit along the separation surface of the object to be separated.

The separating method preferably further comprises executing separation processing for the object while rotating the object about an axis perpendicular to the separation surface of the object to be separated.

In the separating method, the object to be separated preferably has a fragile layer as a separation layer. The fragile layer is preferably a porous layer or a layer having a microcavity.

According to an aspect of the present invention, there is provided method of manufacturing a semiconductor substrate, characterized by comprising the steps of forming a first substrate in which a porous layer and a non-porous layer are sequentially formed on one surface, bonding the first substrate to a second substrate via the non-porous layer to form a bonded substrate stack, and separating the bonded substrate stack into two substrates while ejecting a jet of fluid to the porous layer of the bonded substrate stack, wherein the separation step comprises changing a condition for ejecting the fluid in accordance with progress of the separation step.

According to another aspect of the present invention, there is provided a method of manufacturing a semiconductor substrate, characterized by comprising the steps of implanting ions from a surface of a substrate consisting of a single-crystal semiconductor to a predetermined depth, thereby forming a first substrate in which a microcavity layer is formed, bonding a second substrate to a front surface side of the first substrate to form a bonded substrate stack, and separating the bonded substrate stack into two substrates while ejecting a jet of fluid to the microcavity layer of the bonded substrate stack, wherein the separation step comprises changing a condition for ejecting the fluid in accordance with progress of the separation step.

Further objects, features and advantages of the present invention will become apparent from the following detailed description of embodiments of the present invention with reference to the accompanying drawings.

DETAILED DESCRIPTION OF THE PREFERRED EMBODIMENTS

Preferred embodiments of the present invention will be described below with reference to the accompanying drawings.

FIGS. 1A to 1E are views for explaining a method of manufacturing an SOI substrate according to the first embodiment of the present invention.

Figure 1A:
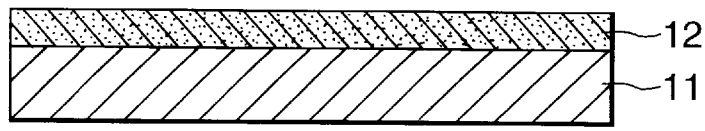
FIGS. 1A to 1E are views for explaining a method of manufacturing an SOI substrate according to the preferred embodiment of the present invention.
Figure 1B:
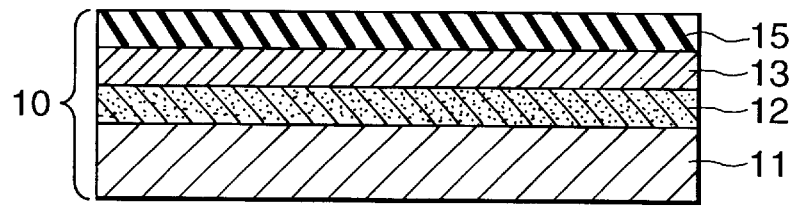

In FIG. 1A, a single-crystal Si substrate 11 is prepared, and a porous Si layer 12 is formed by anodizing on the surface of the single-crystal Si substrate 11. In FIG. 1B, a single-crystal Si layer 13 as a non-porous layer is epitaxially grown on the porous Si layer 12. After this, the surface of the single-crystal Si layer 13 is oxidized to form an $SiO_2$ layer 15. With this process, a first substrate 10 is formed.

Figure 1C:
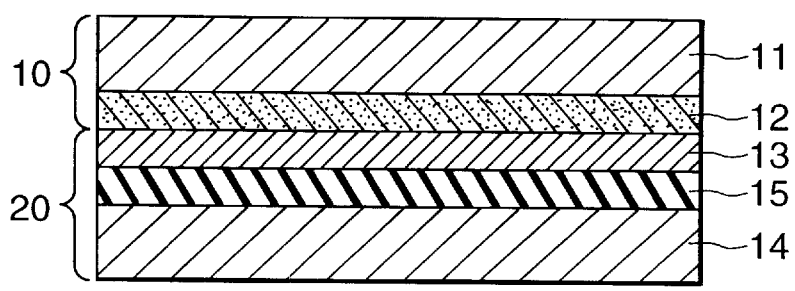

In FIG. 1C, a single-crystal Si substrate 14 is prepared as a second substrate 20. The first and the second substrates 10 and 20 are brought into contact with each other at room temperature such that the $SiO_2$ layer 15 of the first substrate 10 faces the second substrate 20. The first and the second substrates 10 and 20 are bonded by anode bonding, pressing, heating, or a combination thereof. With this process, the second substrate 20 and the $SiO_2$ layer 15 are firmly bonded. The $SiO_2$ layer 15 may be formed on the single-crystal Si substrate 11 side, as described above, or may be formed on the second substrate 20 or on both the single-crystal Si substrate 11 and the second substrate 20 sides as far as the state shown in FIG. 1C is obtained by bringing the first and second substrates into contact.

Figure 1D:
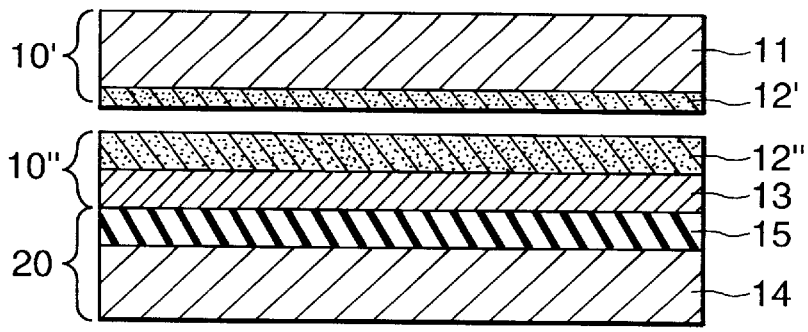

In FIG. 1D, the two substrates bonded to each other are separated at the porous Si layer 12. The second substrate side has a multilayered structure of porous Si layer 12", single-crystal Si layer 13, $SiO_2$ layer 15, and single-crystal Si substrate 14. On the first substrate 10' side, a porous Si layer 12' is formed on the single-crystal Si substrate 11.

After separation, the remaining porous Si layer 12' is removed from the substrate 10'. The surface of the substrate 10' is planarized, as needed, so the substrate 10' is used again as a single-crystal Si substrate 11 for forming a first substrate 10.

Figure 1E:
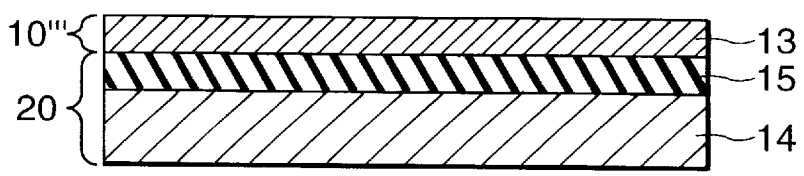

After the bonded substrate stack is separated, in FIG. 1E, the porous layer 12" on the second substrate side (10"+20) is selectively removed. With this process, a substrate having a multilayered structure of single-crystal Si layer 13, insulating layer 15, and single-crystal Si substrate 14, i.e., an SOI structure is obtained.

In this embodiment, in the step shown in FIG. 1D, i.e., in the step of separating the two substrates bonded to each other (to be referred to as a bonded substrate stack hereinafter), a separating apparatus for selectively ejecting a high-pressure liquid or gas (fluid) to the porous Si layer as a separation region is used to separate the substrate stack into two substrates at the separation region.

[Basic Arrangement of Separating Apparatus]

This separating apparatus uses a water jet method. Generally, the water jet method ejects a high-speed, high-pressure stream of water upon an object to, e.g., cut or process a ceramic, a metal, a concrete, a resin, a rubber, or a wood member, remove a coating film from the surface, or clean the surface ("Water Jet", Vol. 1, No. 1, page 4, (1984)).

This separating apparatus ejects a high-speed, high-pressure stream of fluid to the porous layer (separation region) of the bonded substrate stack as a fragile structure portion in the direction of substrate surface to selectively break the porous layer, thereby separating the substrate at the porous layer. The steam will be referred to as a "jet" hereinafter. The fluid forming a jet will be referred to as a "jet medium". As the jet medium, it is possible to use water, an organic solvent such as alcohol, an acid such as fluoric acid or nitric acid, an alkali such as potassium hydroxide, a gas such as air, nitrogen gas, carbonic acid gas, rare gas, or an etching gas, or a plasma.

In this separating apparatus, a jet is ejected to the porous layer (separation region) exposed to the side surface of the bonded substrate stack, thereby removing the porous layer from the peripheral portion to the central portion. With this process, the bonded substrate stack is separated into two substrates by removing only the separation region with low mechanical strength without damaging the main body. Even when the side surface of the bonded substrate stack is covered with some thin layer, and the porous layer is not exposed, the thin layer can be removed by the jet, so the bonded substrate stack can be separated by the above-described method.

Figure 2A:
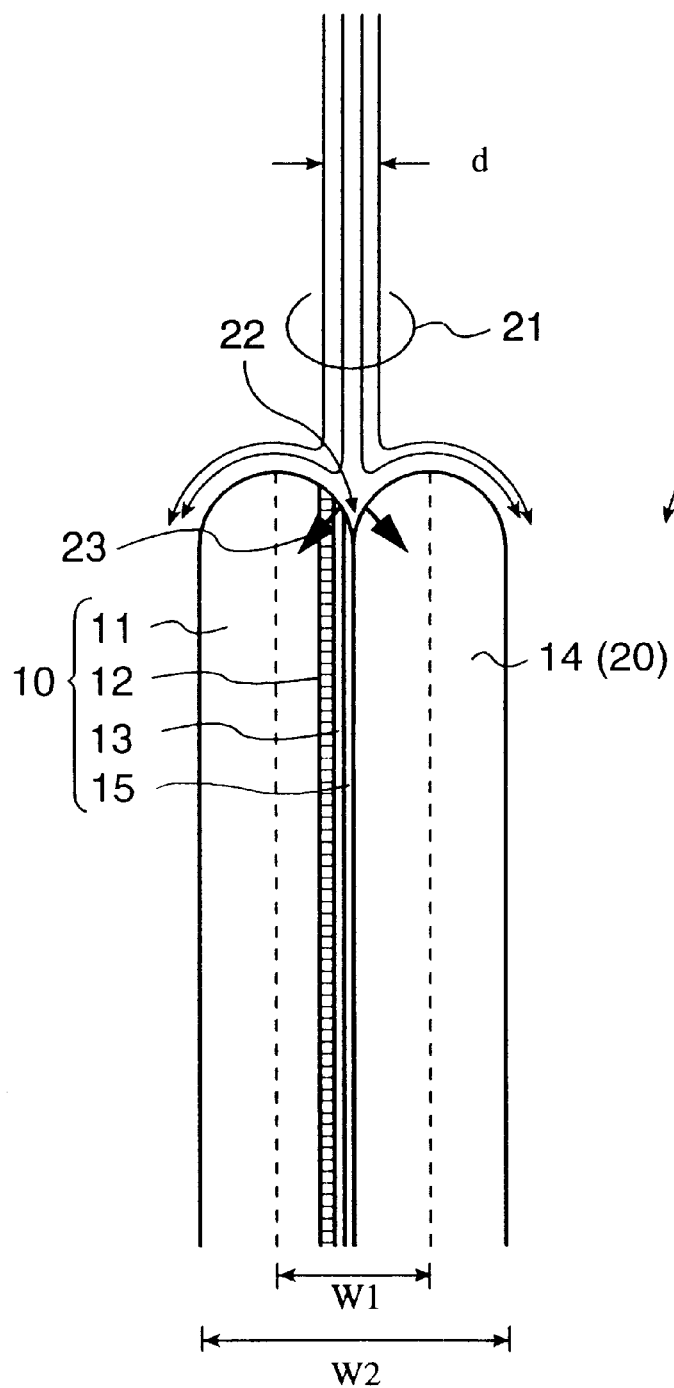
FIGS. 2A and 2B are views showing a force acting on a bonded substrate stack in the presence and absence of a V-shaped groove.
Figure 2B:
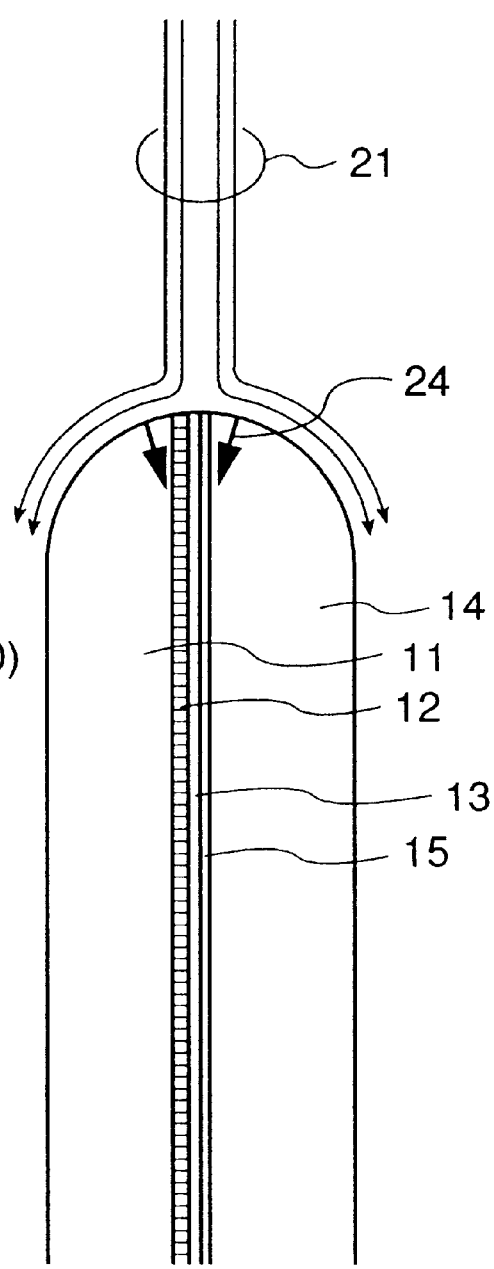

At the peripheral portion of the bonded substrate stack, the effect for splitting the bonded substrate stack into two substrates effectively acts when a V-shaped (concave) groove is formed in the bonded substrate stack along the side surface. FIGS. 2A and 2B are views showing a force acting on the bonded substrate stack in the presence and absence of a V-shaped groove. FIG. 2A shows a bonded substrate stack having a V-shaped groove 22. FIG. 2B shows a bonded substrate stack having no V-shaped groove.

As shown in FIG. 2A, in the bonded substrate stack having the V-shaped groove 22, a force (to be referred to as a separation force hereinafter) is applied outward from the center of the bonded substrate stack, as indicated by an arrow 23. On the other hand, as shown in FIG. 2B, in the bonded substrate stack with a convex side surface, a force is applied inward from the side surface of the bonded substrate stack, as indicated by an arrow 24. In the bonded substrate stack having a convex side surface, the separation force does not act unless the side surface of the porous layer 12 as the separation region is removed by a jet 21.

Even when a thin film is formed on the side surface of the bonded substrate stack, the separation force acts on the bonded substrate stack as far as the bonded substrate stack has the V-shaped groove 22, as shown in FIG. 2A, so the thin layer can be easily broken.

To effectively use the jet, a width W1 of the V-shaped groove 22 is preferably equal to or larger than a diameter d of the jet 21. For example, assume that each of the first substrate 10 and the second substrate 20 has a thickness of about 1 mm, and the bonded substrate stack has a thickness of 2 mm. Since the width W1 of the V-shaped groove 22 is normally 1 mm, the diameter of the jet is preferably 1 mm or less. Since a general water jet apparatus uses a jet with a diameter of 0.1 to 0.5 mm, such a general water jet apparatus (e.g., a water jet nozzle) can be used.

The nozzle for ejecting a jet can have not only a circular shape but any other shapes. For example, when a slit-like nozzle is employed to eject a jet having a long rectangular section, the jet can be efficiently injected into the separation region (inserted between the two substrates).

The jet ejection conditions are determined in accordance with the type of separation region (e.g., a porous layer) or the shape of the side surface of the bonded substrate stack. Important parameters as the jet ejection conditions are the pressure applied to the jet medium, the jet scanning speed, the width or diameter of the nozzle (the nozzle diameter is almost the same as the jet diameter), the nozzle shape, the distance between the nozzle and the separation region, and the flow rate of the jet medium.

The following techniques are used to separate the bonded substrate stack. 1) The jet is injected into the bonding interface parallel to the bonding interface while the nozzle is scanned along the bonding interface. 2) The jet is injected into the bonding interface parallel to the bonding interface while the bonded substrate stack is scanned. 3) The jet is injected into the bonding interface parallel to the bonding interface and simultaneously scanned in a fan shape at a pivot near the nozzle. 4) The jet is injected into the bonding interface parallel to the bonding interface while the bonded substrate stack is rotated about nearly the center of the bonded substrate stack (this technique is particularly effective when the bonded substrate stack has a disk shape). 5) The jet is injected into the bonding interface parallel to the bonding interface while the jet nozzle directing the center of the bonded substrate stack is scanned along the side surface of the bonded substrate stack. The jet need not always be ejected to be perfectly parallel to the bonding interface.

To prevent damage to the substrate, the separation force applied to the bonded substrate stack in the axial direction is preferably several hundred gf per cm$^2$.

Figure 3:
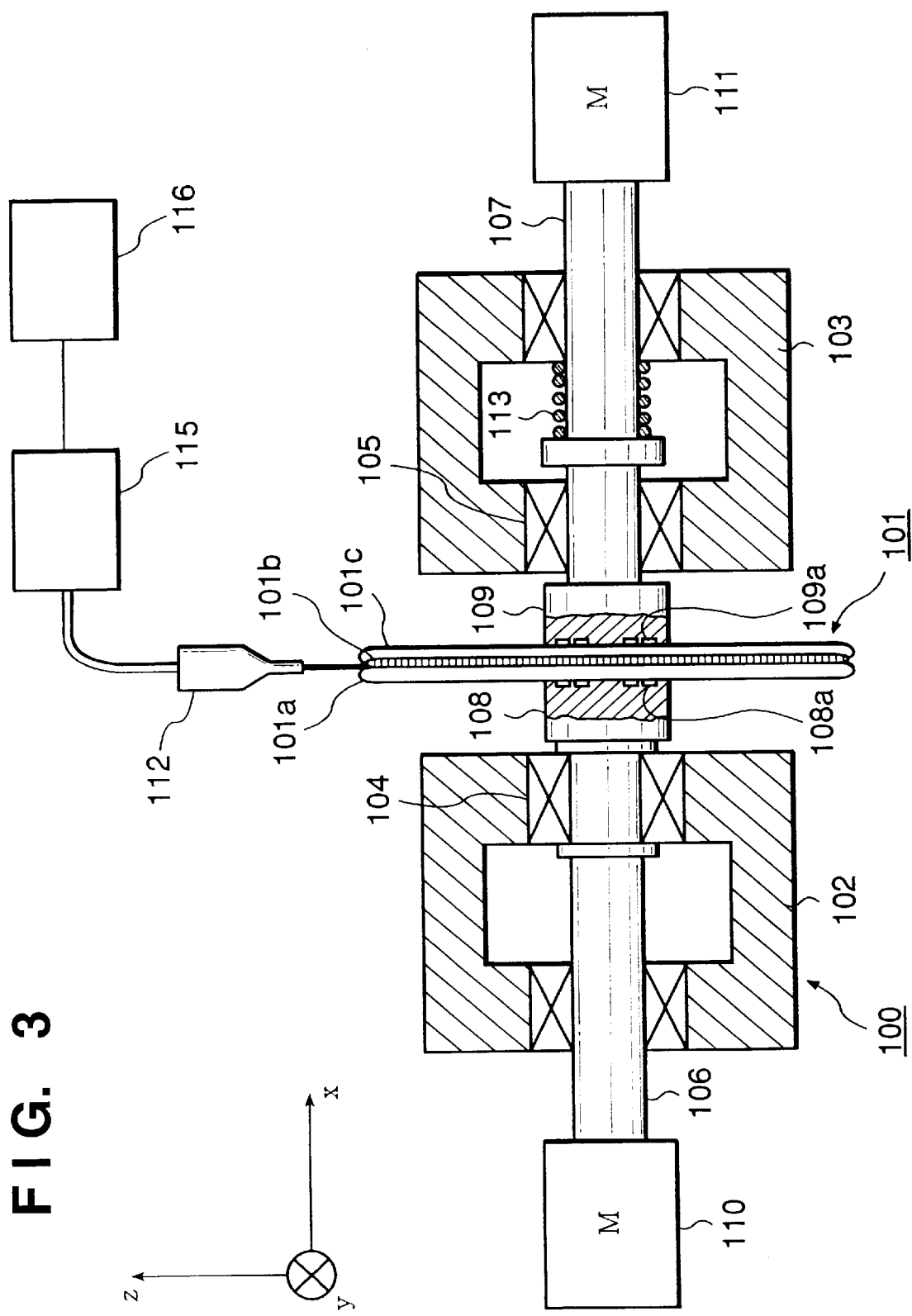
FIG. 3 is a view showing the schematic arrangement of a separating apparatus according to the first embodiment of the present invention.

FIG. 3 is a view showing the schematic arrangement of a separating apparatus according to the preferred embodiment of the present invention. A separating apparatus 100 injects a jet into the porous layer of the bonded substrate stack to separate the bonded substrate stack into two substrates.

The separating apparatus 100 has substrate holding portions 108 and 109 having vacuum chuck mechanisms 108a and 109a. A bonded substrate stack 101 is sandwiched by the substrate holding portions 108 and 109 and held. The bonded substrate stack 101 has a porous layer 101b as a fragile structure. The separating apparatus 100 separates the bonded substrate stack into two substrates 101a and 101c at the porous layer 101b. In this separating apparatus 100, the bonded substrate stack is set such that the substrate 101a is placed on the first substrate 10' side in FIG. 1D and the substrate 101c is placed on the second substrate (10"+20) side in FIG. 1D.

The substrate holding portions 108 and 109 are present on the same central axis. The substrate holding portion 108 is coupled to one end of a rotary shaft 106 which is rotatably axially supported by a support base 102 through bearings 104. The other end of the rotary shaft 106 is coupled to the rotary shaft of a driving source (e.g., a motor) 110 fixed on the support portion 110. The rotational force generated by the driving source 110 rotates the bonded substrate stack 101 vacuum-chucked by the substrate holding portion 108. In separating the bonded substrate stack 101, the driving source 110 rotates the rotary shaft 106 at a designated rotation speed in accordance with an instruction from a controller (not shown).

The substrate holding portion 109 is coupled to one end of a rotary shaft 107 which is rotatably and slidably axially supported by a support portion 103 through bearings 105. The other end of the rotary shaft 107 is coupled to a driving source (e.g., a motor) 111. The speed at which the driving source 110 rotates the rotary shaft 106 and that at which the driving source 111 rotates the rotary shaft 107 must apparently equal each other to prevent the bonded substrate stack 101 from twisting.

Both the driving sources 110 and 111 need not always be prepared, and either one of them may suffice. For example, when only the driving source 110 is used, before the bonded substrate stack 101 is separated, the rotary shaft 106, substrate holding portion 108, bonded substrate stack 101, substrate holding portion 109, and rotary shaft 107 integrally rotate. After the bonded substrate stack 101 is separated into two substrates, the members on the rotary shaft 107 side come to a halt.

Alternatively, the rotational force generated by one driving source may be branched into two forces so that the rotary shafts 106 and 107 are rotated by the branched rotational forces, respectively.

A spring 113 for pressing the bonded substrate stack 101 is attached to the support portion 103 supporting the rotary shaft 107. Therefore, even when the bonded substrate stack 101 is not chucked by the vacuum chuck mechanisms 108a and 109a, the two substrates separated by the jet ejected from a jet nozzle 112 do not drop. In addition, when the bonded substrate stack 101 is separated while being pressed, the bonded substrate stack 101 can be stably held during separation.

A spring for pressing the bonded substrate stack 101 may also be arranged on the rotary shaft 106 side.

The separating apparatus 100 has an adjustment mechanism for adjusting the interval between the substrate holding portions 108 and 109.

Figure 5:
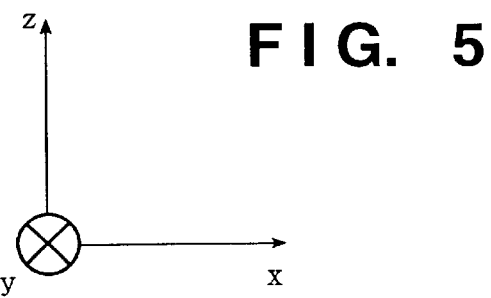
FIG. 5 is a view showing the first arrangement of an adjustment mechanism.

FIG. 5 is a view showing the first arrangement of the adjustment mechanism. FIG. 5 shows an adjustment mechanism using an air cylinder 122. The air cylinder 122 is fixed on, e.g., the support portion 103. The driving source 111 is moved by a piston rod 121. To set the bonded substrate stack 101 in the separating apparatus 100, the air cylinder 122 is controlled to move the driving source 111 in a direction in which the interval between the substrate holding portions 108 and 109 increases (in the positive direction of X-axis). In this state, the bonded substrate stack 101 is set between the substrate holding portions 108 and 109, and driving of he piston rod 121 by the air cylinder 122 is canceled. The substrate holding portion 109 presses the bonded substrate stack 101 by the action of the spring 113.

Figure 6:
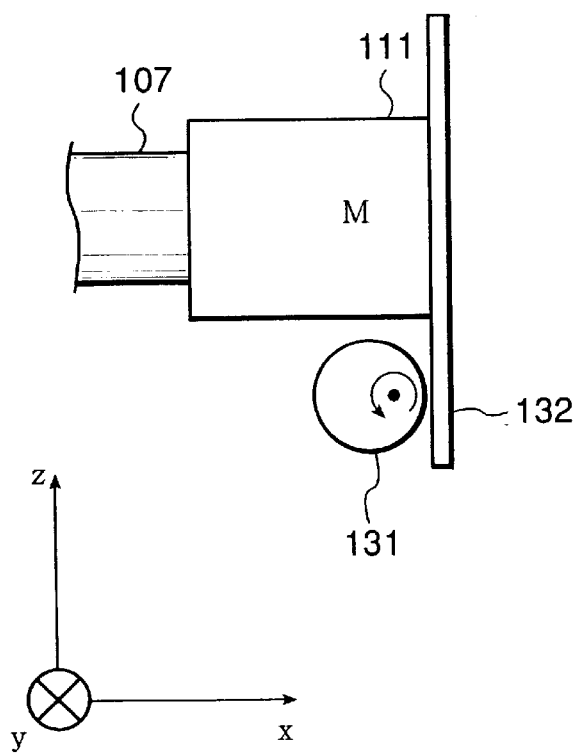
FIG. 6 is a view showing the second arrangement of the adjustment mechanism.

FIG. 6 is a view showing the second arrangement of the adjustment mechanism. FIG. 6 shows an adjustment mechanism using an eccentric cam 131 and a motor. The eccentric cam 131 is coupled to the motor (not shown). The interval between the substrate holding portions 108 and 109 is adjusted by reciprocally moving a driving plate 132 coupled to the rear end of the motor 111. As described above, the spring 113 applies a force to the rotary shaft 107 in the negative direction of X-axis. When the bonded substrate stack 101 is to be held, a gap is formed between the eccentric cam 131 and the driving plate 132. Therefore, when the bonded substrate stack 101 is to be held, a press force acts on the bonded substrate stack 101.

The above mechanism for adjusting the interval between the substrate holding portions 108 and 109 may also be mounted on the substrate holding portion 108 side.

A high-pressure pump 115 is coupled to the jet nozzle 112. When a high-pressure jet medium (e.g., water) is sent from the high-pressure pump 115 to the jet nozzle 112, a jet is ejected from the jet nozzle 112. The pressure applied to the jet medium by the high-pressure pump 115 is controlled by a pressure control section 116.

Substrate separation processing by the separating apparatus 100 will be described next.

To set the bonded substrate stack 101 in the separating apparatus 100, first, the bonded substrate stack 101 is inserted between the substrate holding portions 108 and 109 by a conveyor robot and held while the center of the bonded substrate stack 101 matches that of the substrate holding portions 108 and 109. The bonded substrate stack 101 is vacuum-chucked by the substrate holding portion 108.

Next, the substrate holding portion 109 is pressed against the bonded substrate stack 101 by the force of the spring 113. More specifically, when the adjustment mechanism shown in FIG. 5 is employed to adjust the interval between the substrate holding portions 108 and 109, driving of the piston rod 121 by the air cylinder 122 is canceled. When the adjustment mechanism shown in FIG. 6 is employed, the eccentric cam 131 is rotated such that the press force of the spring 113 acts on the bonded substrate stack 101.

When separation processing is to be executed, the bonded substrate stack 101 need not always be vacuum-chucked by the vacuum chuck mechanisms 108a and 109a. This is because the bonded substrate stack 101 is held by the press force of the spring 113. However, when a weak press force is used, the bonded substrate stack 101 is preferably vacuum-chucked.

The rotary shafts 106 and 107 are rotated by the driving sources 110 and 111 in synchronism with each other. In this state, the high-pressure jet medium (e.g., water) is sent from the high-pressure pump 115 to the jet nozzle 112 while the pressure is controlled by the pressure control section 116, thereby ejecting a high-speed, high-pressure jet from the jet nozzle 112. The ejected jet is injected into the separation region of the bonded substrate stack 101. When the jet is injected, the porous layer 101b or the fragile structure of the bonded substrate stack 101 is broken, so the bonded substrate stack 101 is separated into two substrates at the porous layer 101b.

Subsequently, while injecting the jet into the separation region (porous layer 101b) of the bonded substrate stack 101, the two separated substrates 101a and 101c are physically split from each other. More specifically, when the adjustment mechanism shown in FIG. 5 is employed to adjust the interval between the substrate holding portions 108 and 109, the piston rod 121 is driven by the air cylinder 122 in the positive direction of X-axis (direction in which the spring 113 compresses) while the substrates are vacuum-chucked by the substrate holding portions 108 and 109, respectively. When the adjustment mechanism shown in FIG. 6 is employed, the eccentric cam 131 is rotated to drive the rotary shaft 107 in the positive direction of X-axis (direction in which the spring 113 compresses) while the substrates are vacuum-chucked by the substrate holding portions 108 and 109, respectively.

Figure 4:
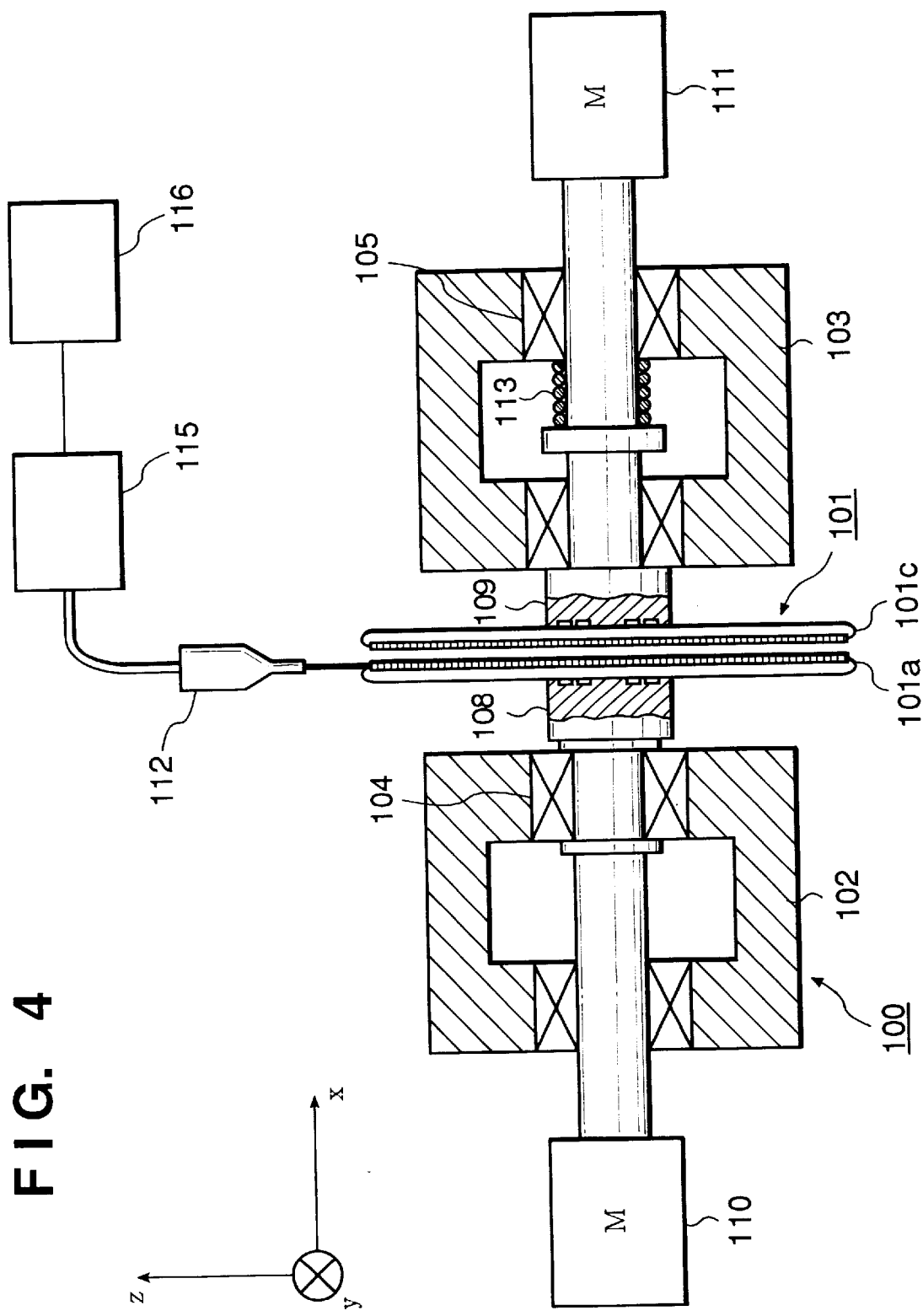
FIG. 4 is a view showing the schematic arrangement of the separating apparatus according to the first embodiment of the present invention.

Then the substrates 101a and 101c are completely split, as shown in FIG. 4, jet ejection is stopped, and the substrates are detached from the substrate holding portions 108 and 109 by, e.g., the conveyor robot.

The jet nozzle 112 may be fixed in position but is preferably movable. This is because the position of the jet nozzle 112 is preferably adjusted in accordance with the type or size of bonded substrate stack 101.

Figure 7:
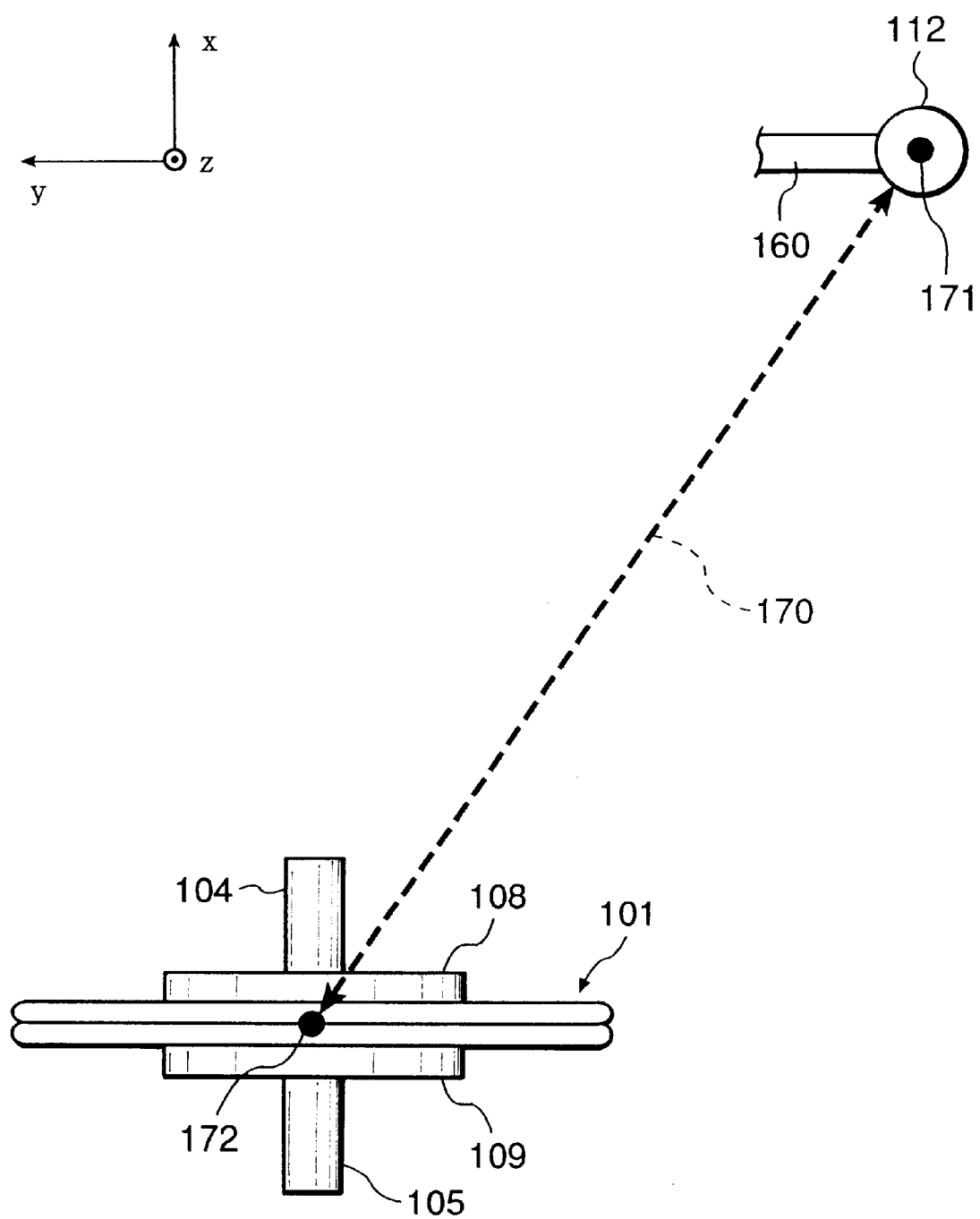
FIG. 7 is a view showing an example of a jet nozzle driving robot.

FIG. 7 is a view showing the driving robot of the jet nozzle 112. A driving robot 160 shown in FIG. 7 moves the jet nozzle 112 along a path 170. When the bonded substrate stack 101 is to be attached/detached to/from the substrate holding portions 108 and 109, the driving robot 160 moves the jet nozzle 112 to a retreat positiom 171. When the bonded substrate stack 101 is to be separated and split, the driving robot 160 moves the jet nozzle 112 to an operation position 172. As described above, when the jet nozzle 112 is retreated in attaching/detaching the bonded substrate stack 101, the operation of attaching/detaching the bonded substrate stack 101 and, more particularly, the operation of attaching/ detaching the bonded substrate stack 101 using the conveyor robot can be efficiently performed.

It is also effective to scan the jet nozzle 112 on the separation region of the bonded substrate stack 101 in the planar direction of the bonded substrate stack 101 during separation and split of the bonded substrate stack 101. In this case, the bonded substrate stack 101 can be separated well without rotating it.

Figure 8:
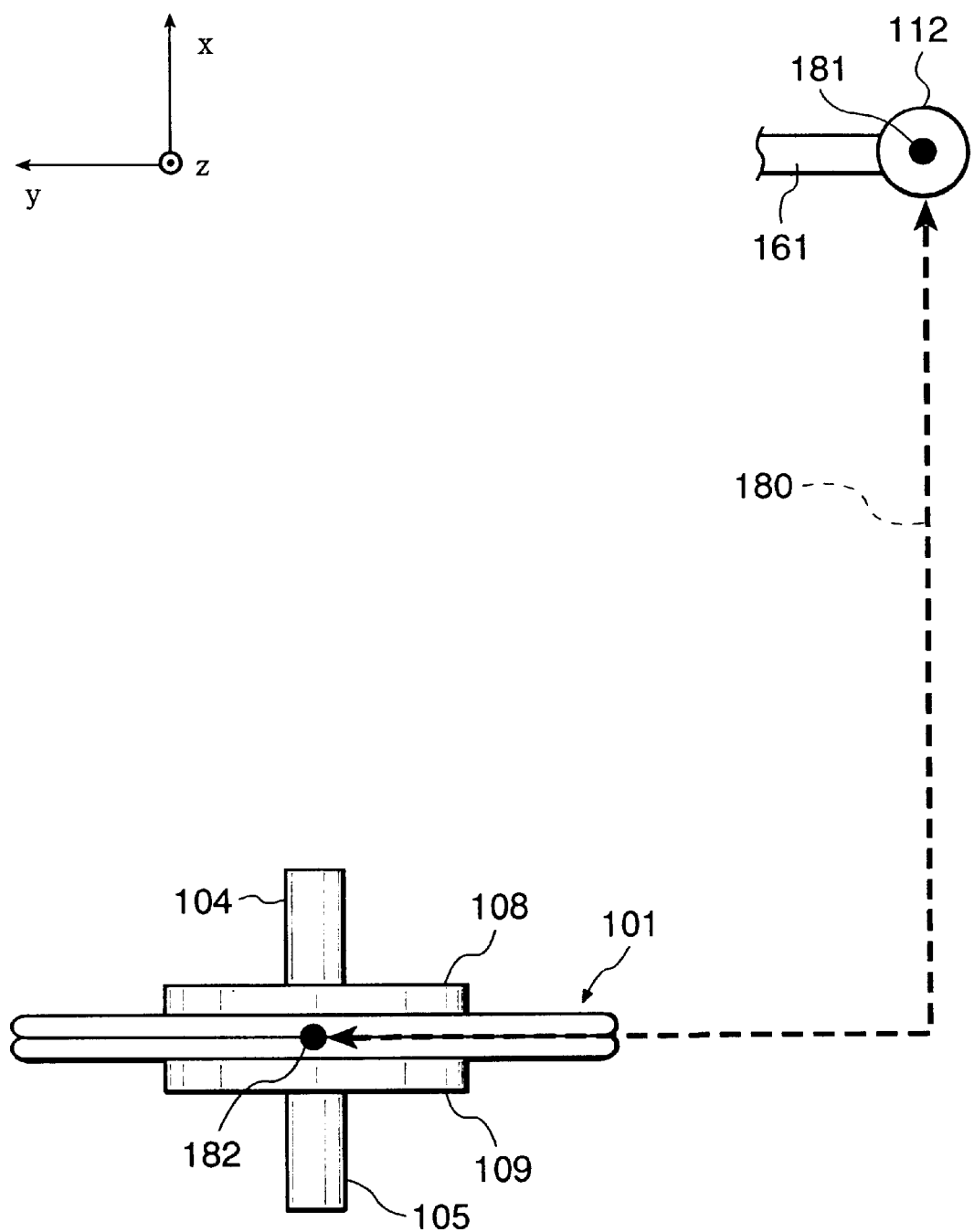
FIG. 8 is a view showing another example of the jet nozzle driving robot.

FIG. 8 is a view showing another example of the driving robot of the jet nozzle 112. A driving robot 161 shown in FIG. 8 moves the jet nozzle 112 along a path 180. When the bonded substrate stack 101 is to be attached/detached to/from the substrate holding portions 108 and 109, the driving robot 161 moves the jet nozzle 112 to a retreat position 181. When the bonded substrate stack 101 is to be separated and split, the driving robot 161 moves the jet nozzle 112 to an operation position 182. As described above, when the jet nozzle 112 is retreated in attaching/detaching the bonded substrate stack 101, the operation of attaching/ detaching the bonded substrate stack 101 and, more particularly, the operation of attaching/detaching the bonded substrate stack 101 using the conveyor robot can be efficiently performed.

It is also effective to scan the jet nozzle 112 on the separation region of the bonded substrate stack 101 in the planar direction of the bonded substrate stack 101 during separation and split of the bonded substrate stack 101. In this case, the bonded substrate stack 101 can be separated well without rotating it.

The separating apparatus 100 separates the bonded substrate stack while appropriately changing the jet pressure. The reason for this is as follows.

The jet pressure required to separate the bonded substrate stack 101 changes depending on the portion of the separation region of the bonded substrate stack. For example, the separation force acting on the bonded substrate stack changes between the peripheral and the central portions of the bonded substrate stack 101, so the jet pressure necessary for separation changes between the peripheral and the central portions. When the bonded substrate stack 101 is to be separated using a constant jet pressure, a high-pressure jet must be used throughout the separation processing. In this case, the bonded substrate stack or separated substrates may break or be damaged, resulting in a low yield.

To solve this problem, the mechanical strength of the separation region can be lowered. However, when the separation region is made excessively fragile, the separation region readily breaks in the step of bonding or cleaning the two substrates (first and second substrates), so it becomes difficult to manufacture a substrate with desired quality. In addition, particles may be generated from the broken separation region to contaminate the manufacturing apparatus and the like.

To appropriately control the jet pressure during bonded substrate stack separation processing, the pressure is controlled on the basis of the positional relationship between the jet nozzle 112 and the bonded substrate stack 101 or in accordance with time.

Figure 9:
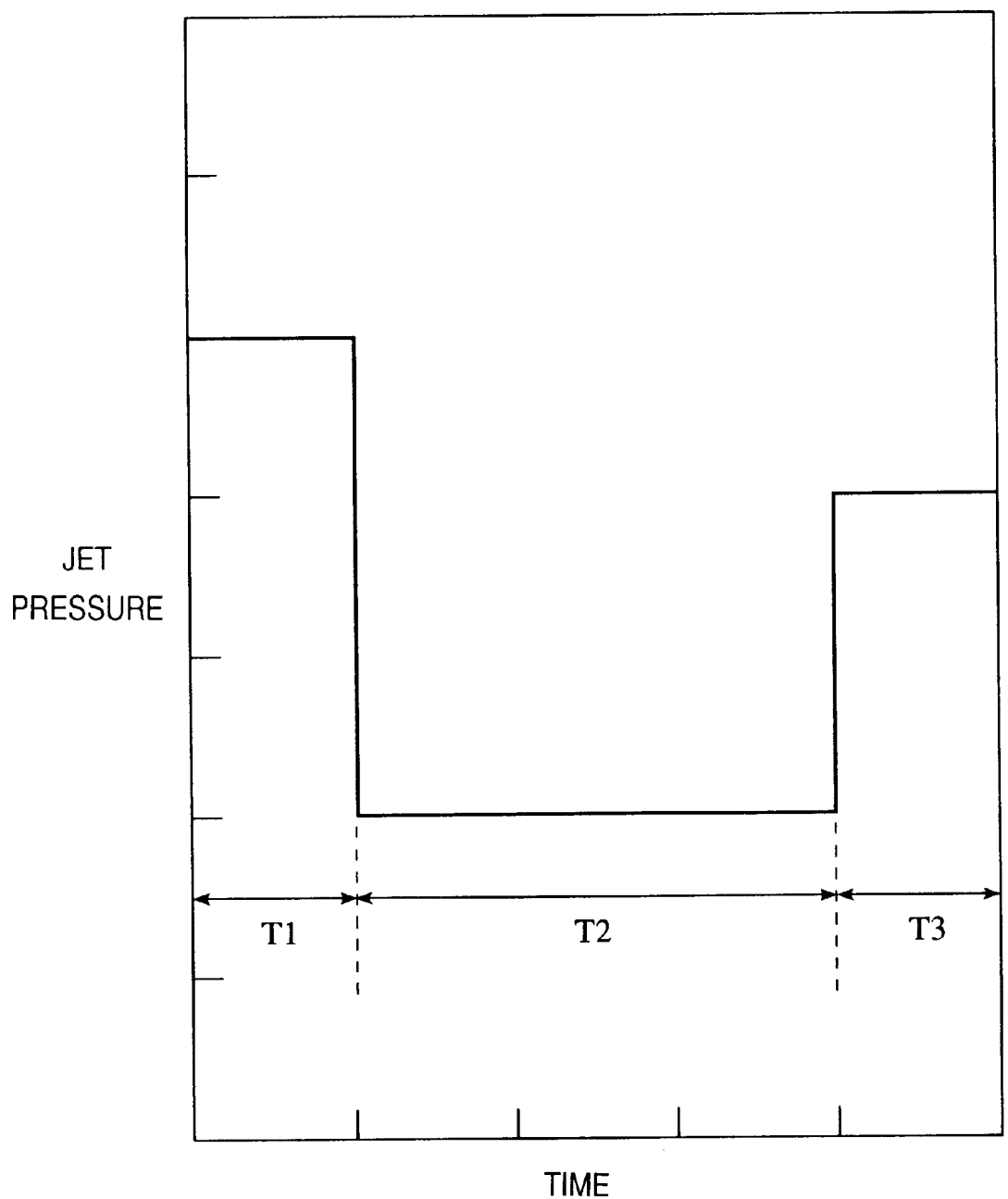
FIG. 9 is a chart showing control in separation processing.
Figure 10:
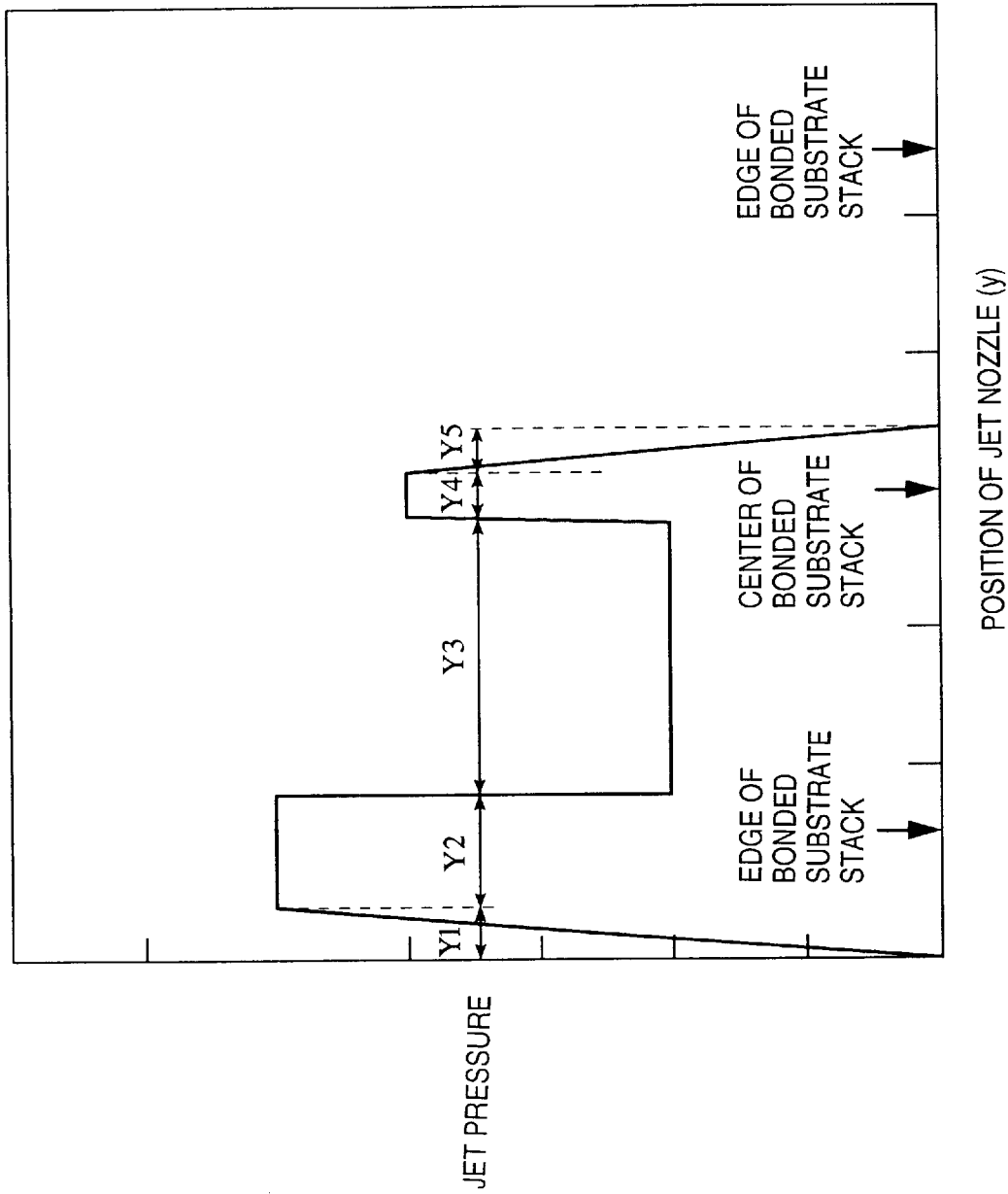
FIG. 10 is a chart showing control in separation processing.
Figure 11:
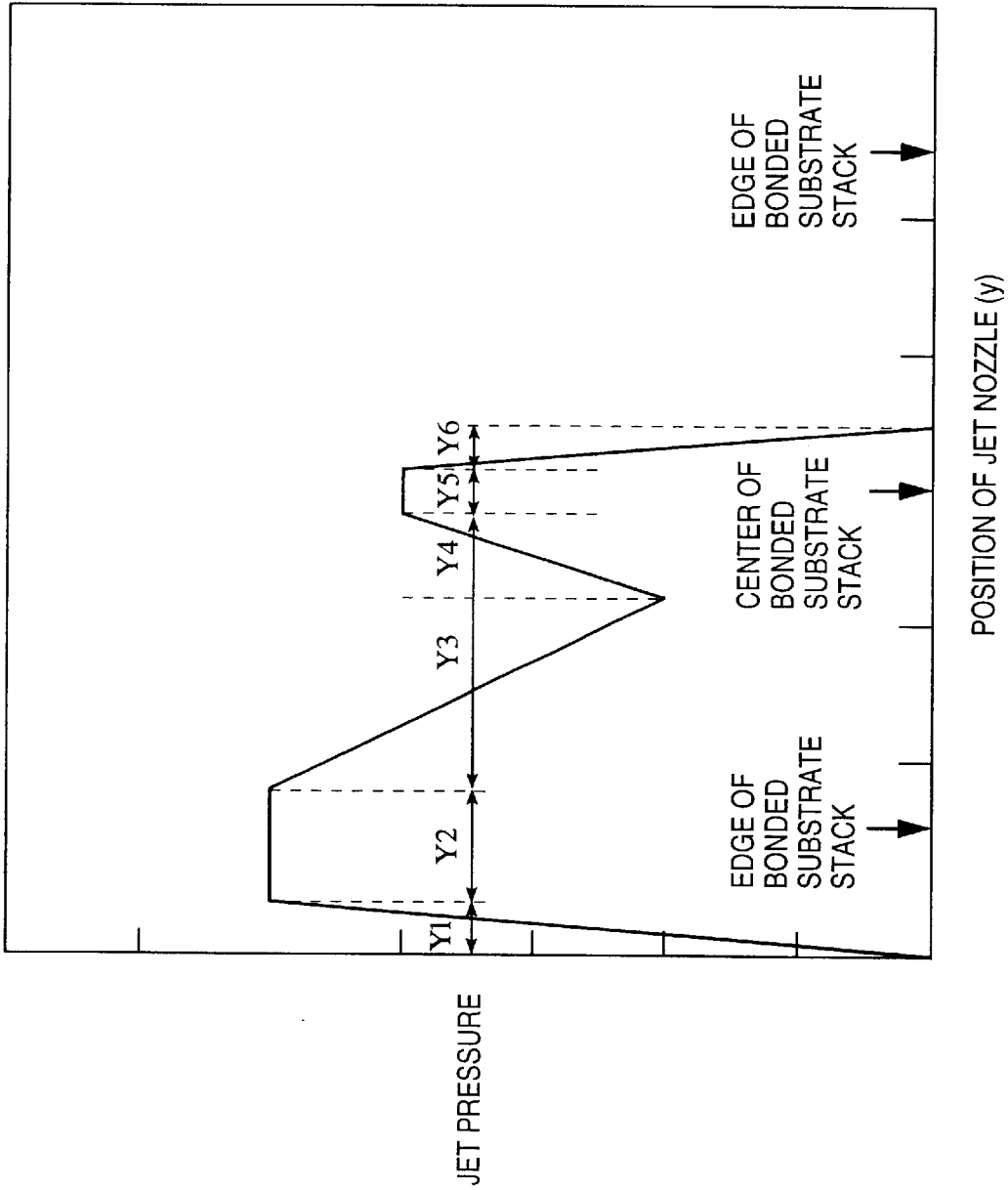
FIG. 11 is a chart showing control in separation processing.

FIGS. 9 to 11 are charts showing examples of jet pressure control during separation processing. The pressure control section 116 controls the pressure (jet pressure) generated by the high-pressure pump 115, on the basis of one of the control procedures shown in FIGS. 9 to 11.

FIG. 9 shows a control example in which separation processing is executed while fixing the jet nozzle 112 at the operation position 172 or 182 shown in FIGS. 7 or 8 and rotating the bonded substrate stack 101. In the example shown in FIG. 9, the jet pressure is adjusted in three steps. In a period T1, the peripheral portion of the bonded substrate stack 101 is mainly separated. During the period T1, the jet injected into the bonded substrate stack 101 is easily discharged, and the separation force hardly acts on the bonded substrate stack 101, so the jet pressure is set to be high. At the peripheral portion of the bonded substrate stack 101, the jet medium is easily discharged, as described above. For this reason, even when the jet pressure is set to be relatively high, the bonded substrate stack 101 does not break.

In a period T2, the intermediate portion between the peripheral portion and the central portion of the bonded substrate stack 101 (to be simply referred to as an intermediate portion hereinafter) is mainly separated. Since the speed of jet lowers at the intermediate portion, the function of separating the bonded substrate stack 101 weakens due to the impact of the jet medium hitting the porous layer. However, at the intermediate portion, the discharge paths of the jet medium injected into the bonded substrate stack 101 decrease. The separation force due to the pressure of the jet medium injected into the bonded substrate stack 101 increases, and the bonded substrate stack 101 is separated mainly by this separation force. When the same pressure as that for the peripheral portion is applied to the jet medium, the bonded substrate stack 101 may break. For this reason, the pressure of the jet medium is set to be relatively low at the intermediate portion.

In a period T3, the central portion of the bonded substrate stack 101 is mainly separated. When the separated portion is close to the central portion, the separated portion of the bonded substrate stack 101 warps to increase the discharge paths of the jet medium. The pressure of the jet medium is reduced as compared to that in separating the intermediate portion, resulting in a smaller separation force. For this reason, at the central portion, the pressure of the jet medium is preferably set to be higher than that in separating the intermediate portion.

As described above, by appropriately changing the pressure of jet to be ejected from the jet nozzle 112 in accordance with the time elapse in separation processing, damage to the bonded substrate stack can be reduced while increasing the efficiency of separation processing.

Figure 12:
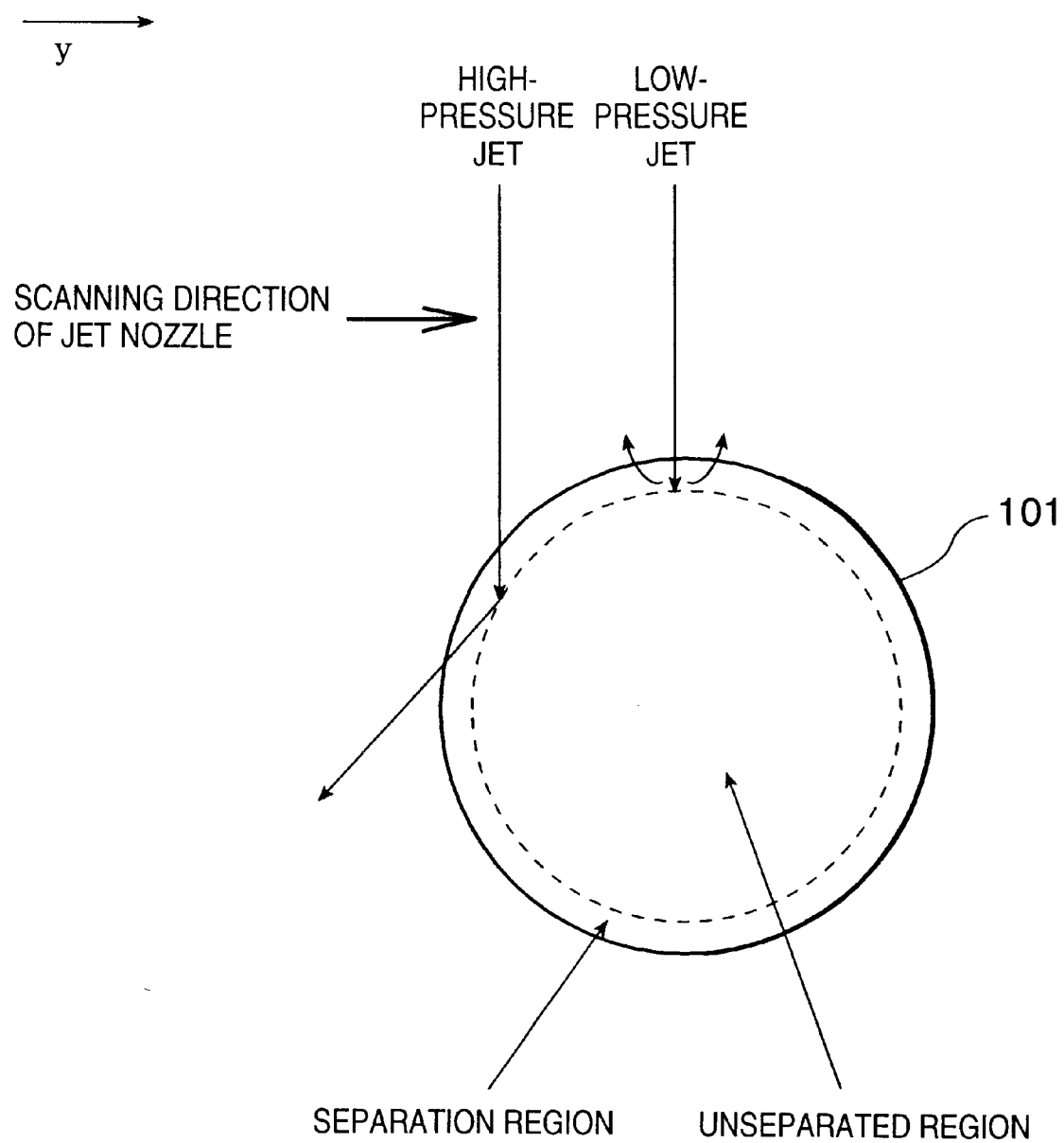
FIG. 12 is a view showing the force of jet acting on the bonded substrate stack.

FIG. 10 shows a control example in which separation processing is executed while scanning the jet nozzle 112 along the separation region of the bonded substrate stack 101 and simultaneously rotating the bonded substrate stack 101. FIG. 12 is a view showing the force of jet acting on the bonded substrate stack 101. When the jet is injected toward the peripheral portion of the bonded substrate stack 101, the jet injected against the bonded substrate stack 101 is easily discharged outward, as shown in FIG. 12, and the separation force of jet does not efficiently act on the bonded substrate stack 101. On the other hand, when the jet is injected toward the central portion of the bonded substrate stack 101, the jet injected against the bonded substrate stack 101 efficiently separates the bonded substrate stack 101. According to this example, when the jet nozzle 112 is to be scanned along the porous layer, the jet pressure is preferably changed in accordance with the positional relationship between the jet nozzle 112 and the bonded substrate stack 101.

In a section Y1, the jet pressure is stabilized. In a section Y2, the peripheral portion of the bonded substrate stack 101 is mainly separated. In this section Y2, since the jet is not efficiently injected against the bonded substrate stack 101, the jet pressure is preferably set to be relatively high, as described above.

In a section Y3, the intermediate portion of the bonded substrate stack 101 is mainly separated. In this section Y3, since the jet efficiently separates the bonded substrate stack 101, as compared to the section Y2, the jet pressure is preferably set to be lower than that in the section Y2 to prevent damage to the bonded substrate stack 101.

In a section Y4, the central portion of the bonded substrate stack 101 is mainly separated. When the separated portion is close to the central portion by scanning the jet nozzle 112, the separated portion of the bonded substrate stack 101 warps to increase the discharge paths of the jet medium. The pressur[0085] of the jet medium is reduced as compared to that in separating the intermediate portion, resulting in a smaller separation force. For this reason, at the central portion, the pressure of the jet medium is preferably set to be higher than that in separating the intermediate portion. In this example, the bonded substrate stack 101 is separated while rotating it. Hence, separation of the bonded substrate stack 101 is complete when the jet nozzle 112 is scanned from the peripheral portion to the central portion of the bonded substrate stack 101. In a section Y5, the pressure of the high-pressure pump is gradually reduced to stop the pump operation.

As described above, when the pressure of jet ejected from the jet nozzle 112 is appropriately changed in accordance with the positional relationship between the jet nozzle 112 and the bonded substrate stack 101, damage to the bonded substrate stack can be reduced while increasing the efficiency of separation processing.

FIG. 11 shows another control example in which separation processing is executed while scanning the jet nozzle 112 along the separation region of the bonded substrate stack and simultaneously rotating the bonded substrate stack 101. In this control example, the jet pressure is more smoothly changed in the section from the peripheral portion to the intermediate portion and in the section from the intermediate portion to the central portion, as compared to the control example shown in FIG. 10.

In the section Y1, the jet pressure is stabilized. In the section Y2, the peripheral portion of the bonded substrate stack 101 is mainly separated. In this section Y2, since the jet is not efficiently injected against the bonded substrate stack 101, the jet pressure is preferably set to be relatively high, as described above.

In the sections Y3 and Y4, the intermediate portion of the bonded substrate stack 101 is mainly separated. In the section Y3, the jet pressure is gradually reduced. In the section Y4, the jet pressure is gradually raised.

In the section Y5, the central portion of the bonded substrate stack 101 is mainly separated. In a section Y6, the pressure of the high-pressure pump is gradually reduced to stop the pump operation.

As described above, when the pressure of jet ejected from the jet nozzle 112 is smoothly changed in accordance with the positional relationship between the jet nozzle 112 and the bonded substrate stack 101, the bonded substrate stack 101 can be separated by a jet having a more appropriate pressure.

The methods of changing the pressure of jet ejected from the jet nozzle 112 are not limited to the above three examples. The method can be appropriately changed in accordance with the type or size of bonded substrate stack, the type or size of separation layer, or the bonded substrate stack holding method.

Figure 13:
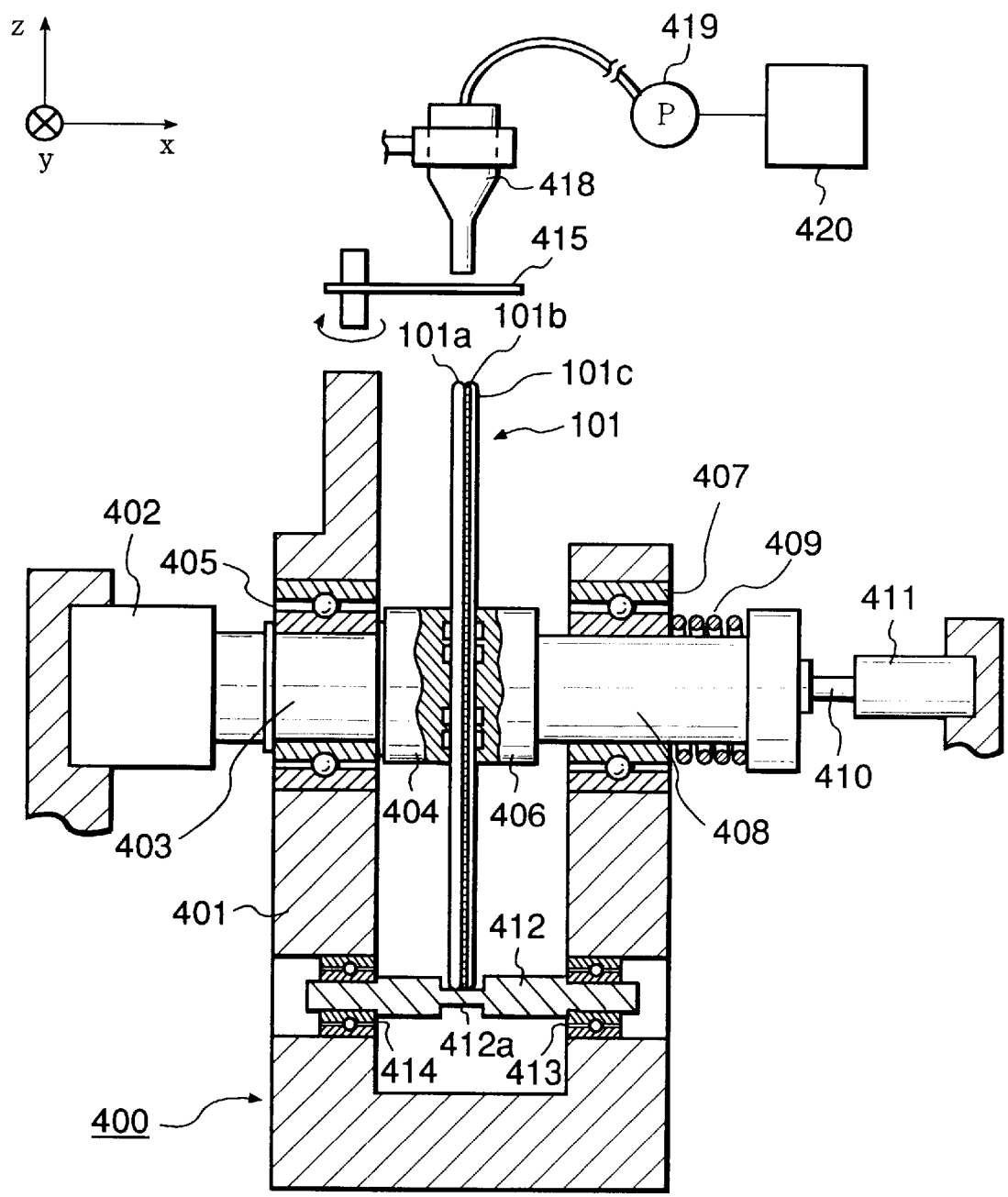
FIG. 13 is a view showing the arrangement of a separating apparatus according to the second embodiment of the present invention.

The arrangement of a separating apparatus according to the second embodiment of the present invention will be described next. FIG. 13 is a view showing the arrangement of the separating apparatus according to the second embodiment of the present invention.

A separating apparatus 400 has substrate holding portions 404 and 406 having vacuum chucks. A bonded substrate stack 101 is sandwiched by the substrate holding portions 404 and 406 and held. The bonded substrate stack 101 has a porous layer 101b as a fragile structure. The separating apparatus 400 separates the bonded substrate stack into two substrates 101a and 101c at the porous layer 101b. In this separating apparatus 400, the bonded substrate stack is set such that the substrate 101a is placed on the first substrate 10' side in FIG. 1D and the substrate 101c is placed on the second substrate (10"+20) side in FIG. 1D.

The substrate holding portion 404 is coupled to one end of a rotary shaft 403 which is rotatably axially supported by a support base 401 through a bearing 405. The other end of the rotary shaft 403 is coupled to the rotary shaft of a motor 402. The rotational force generated by the motor 402 rotates the bonded substrate stack 101 vacuum-chucked by the substrate holding portion 404. In separating the bonded substrate stack 101, the motor 402 rotates the rotary shaft 403 at a designated rotation speed in accordance with an instruction from a controller (not shown).

The substrate holding portion 406 is coupled to one end of a rotary shaft 408 which is rotatably and slidably axially supported by the support base 401 through a bearings 407.

A compression spring 409 is attached to the other end of the rotary shaft 408. With this arrangement, the bonded substrate stack 101 receives a force from the compression spring 409 in a direction (X-axis direction) in which the substrate 101a and the porous layer 101b are spaced apart from each other. Consequently, when the bonded substrate stack 101 is separated into the substrate 101a side and the substrate 101c side by a jet from a jet nozzle 418, the substrate 101a side moves in the X-axis direction to be split from the substrate 101c side.

Before the bonded substrate stack 101 is separated, the rotational force of the rotary shaft 403 is transmitted to the substrate holding portion 406 through the bonded substrate stack 101. As a result, the rotary shaft 403, substrate holding portion 404, bonded substrate stack 101, substrate holding portion 406, rotary shaft 408, and compression spring 409 integrally rotate. When the bonded substrate stack 101 is separated into two substrates, the rotary shaft 408 stops.

An air cylinder 411 is arranged on the rear end side (in the X-axis direction) of the rotary shaft 408. When the bonded substrate stack 101 is to be held by the substrate holding portions 404 and 406, the air cylinder 411 pushes a piston rod to move the rear end of the rotary shaft 408 in a direction (negative direction of X-axis) in which the compression spring 409 compresses (the state shown in FIG. 13). After the bonded substrate stack 101 is held by suction by the vacuum chucks, the air cylinder 411 retracts the piston rod 410 (moves the piston rod 410 in the X-axis direction) to allow to separate the bonded substrate stack 101. That is, the air cylinder 411 pushes the piston rod 410 in setting the bonded substrate stack 101 between the substrate holding portions 404 and 406 and retracts the piston rod 410 upon completing setting.

To set the bonded substrate stack 101 in the separating apparatus 400, the bonded substrate stack 101 is mounted on a groove portion 412a of an alignment shaft 412 axially supported by the support base 401 through bearings 413 and 414, and then, the piston rod 410 is pushed to bring the substrate holding portion 406 into contact with the bonded substrate stack 101, as described above. In this state, the vacuum chucks of the substrate holding portions 404 and 406 are actuated.

Two alignment shafts 412 are preferably arranged along the Y-axis. In this case, only by placing the bonded substrate stack 101 on the two alignment shafts 412, the position of the bonded substrate stack 101 with respect to the three directions, i.e., the X-, Y-, and Z-directions can be defined. This facilitates manual setting of the bonded substrate stack 101. In addition, if a conveyor robot is to be employed, the arrangement of the conveyor robot can be simplified.

To remove the separated substrates, the substrate 101a side moves in the X-axis direction upon completing separation processing to split the two substrates. After this, the two substrates are held by, e.g., the conveyor robot, and the suction by the vacuum chucks of the substrate holding portions 404 and 406 is released.

A high-pressure pump 419 is coupled to the jet nozzle 418. When a high-pressure jet medium is sent from the high-pressure pump 419 to the jet nozzle 418, a jet is ejected from the jet nozzle 418. The pressure applied to the jet medium by the high-pressure pump 419 is controlled by a pressure control section 420 in accordance with one of the control procedures shown in FIGS. 9 to 11.

A shutter 415 is used to prevent the jet from hitting the bonded substrate stack 101 before the jet pressure reaches a predetermined pressure.

In the separating apparatus 400 as well, the jet pressure is appropriately controlled while the bonded substrate stack is separated. For example, the jet pressure is controlled on the basis of the positional relationship between the jet nozzle 418 and the bonded substrate stack 101 or in accordance with time. The control examples shown in FIGS. 9 to 11 can also be applied to the separating apparatus 400.

Figure 14:
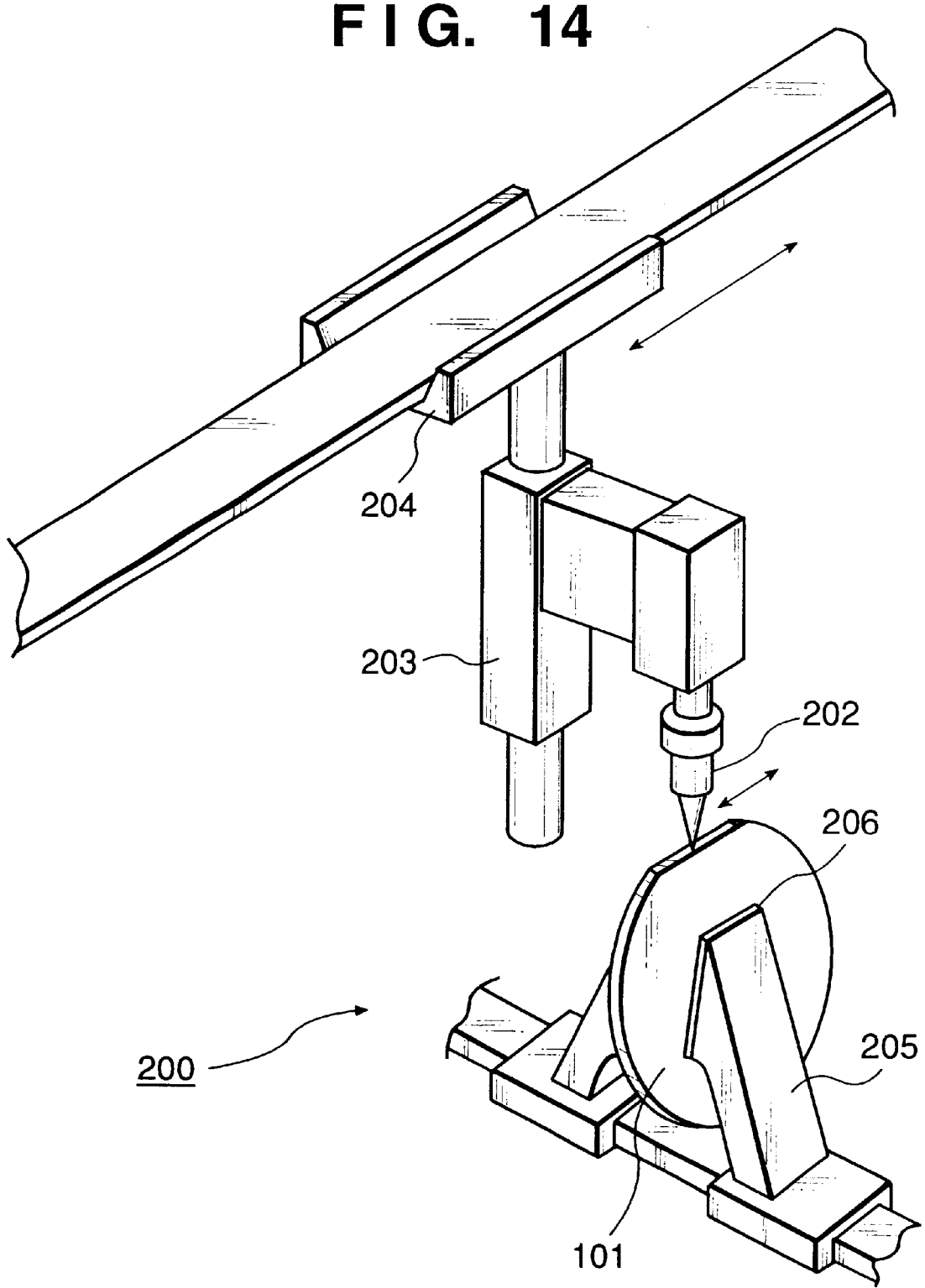
FIG. 14 is a view showing the arrangement of a separating apparatus according to the third embodiment of the present invention.

The arrangement of a separating apparatus according to the third embodiment of the present invention will be described next. FIG. 14 is a view showing the arrangement of the separating apparatus according to the third embodiment of the present invention. In a separating apparatus 200, substrate holding portions 205 hold a bonded substrate stack 101 fixed in position, and a jet nozzle 202 is scanned by a horizontal driving mechanism 204 along the separation layer of the bonded substrate stack 101. Vertical position adjustment of the jet nozzle 202 is performed by a vertical driving mechanism 203.

In each of the above separating apparatuses, when the strength of the separation region (porous layer) of the bonded substrate stack is not uniform, the jet pressure is preferably adjusted in accordance with the strength.

Each of the above separating apparatuses can be applied to separate not only a semiconductor substrate such as a bonded substrate stack but also various objects. The object preferably has a fragile structure as a separation layer.

Each of the above separating apparatuses processes one bonded substrate stack. However, when a plurality of bonded substrate stacks are aligned along the planar direction, and the jet nozzle of the separating apparatus is scanned in the planar direction, the plurality of bonded substrate stacks can be separated at once.

Alternatively, when a plurality of bonded substrate stacks are aligned in the axial direction, and a mechanism for scanning the jet nozzle of the separating apparatus in the axial direction is used, the plurality of bonded substrate stacks can be sequentially separated.

Application examples of the above separating apparatuses will be described below. The separating apparatuses are especially suitable to separate a substrate having a fragile layer as a separation layer. As the separation layer, a porous layer, a microcavity layer formed by ion implantation, or a heteroepitaxial layer with distortion or defects concentrated at the crystal lattice can be used. The separation layer may be formed from a plurality of layers having different structures, e.g., a plurality of layers having different porosities.

EXAMPLE 1

A first p- or n-type single-crystal Si substrate having a size of 6 inches and a resistivity of 0.01 Ω·cm was anodized in an HF solution to form a porous Si layer (corresponding to the step shown in FIG. 1A). The anodizing conditions were as follows.

Current density: 7 (mA/cm$^2$)

Anodizing solution: HF:H$_2$O:C$_2$H$_5$OH=1:1:1

Time: 11 (min)

Thickness of porous Si: 12 ($\mu$m)

The porous Si is used to form a high-quality epitaxial Si layer on the porous Si layer and also serves as a separation layer. The thickness of the porous Si layer is not limited to the above thickness and is preferably several hundred to 0.1 $\mu$m.

This substrate was oxidized in an oxygen atmosphere at 400° C. for 1 hr. Upon oxidation, the inner wall of each pore of the porous Si layer was covered with a thermal oxide film. The surface of the porous Si layer was treated with hydrofluoric acid to remove only the oxide film on the surface of the porous Si layer while leaving the oxide film on the inner wall of each pore. After this, single-crystal Si was epitaxially grown on the porous Si layer to 0.3 $\mu$m by CVD (Chemical Vapor Deposition). The growing conditions were as follows.

Source gas: SiH$_2$Cl$_2$/H$_2$

Gas flow rate: 0.5/180 (1/min)

Gas pressure: 80 (Torr)

Temperature: 950 (° C.)

Growth rate: 0.3 ($\mu$m/min)

As an insulating layer, an oxide film (SiO$_2$ layer) having a thickness of 200 nm was formed on the surface of the epitaxial Si layer by thermal oxidation (corresponding to the step shown in FIG. 1B).

The first substrate and a second Si substrate which was independently prepared were stacked and brought into contact with each other such that the surface of the SiO$_2$ layer of the first substrate opposed the surface of the second substrate. The resultant structure was subjected to a heat treatment at 1,100° C. for 1 hr to bond the two substrates (corresponding to the step shown in FIG. 1C).

Next, the resultant bonded substrate stack 101 was separated using the separating apparatus 200 shown in FIG. 14 (corresponding to the step shown in FIG. 1D). Details will be described below.

First, as shown in FIG. 14, the bonded substrate stack 101 was sandwiched by the substrate holding portions 205 and vertically held. Pure water was ejected from the jet nozzle 202 having a diameter of 0.15 mm at a pressure of 2,200 kgf/cm$^2$. The jet nozzle 202 was scanned, by the horizontal driving mechanism 204, immediately above the bonded substrate stack 101 along the concave portion of the bevelling at a predetermined speed of 10 mm/sec.

While the jet nozzle 202 moved from a portion immediately above the edge of the bonded substrate stack 101 toward the center (in the scanning direction) of the bonded substrate stack 101 by 15 mm, the jet pressure was maintained at 2,200 kgf/cm$^2$.

When the jet nozzle 202 passed the position, the jet pressure was continuously reduced. The rate of pressure reduction was −100 kgf/cm$^2$ per cm of the moving distance of the jet nozzle 202. When the jet nozzle 202 passed immediately above the center of the bonded substrate stack 101, the jet pressure was 1,600 kgf/cm$^2$.

After the jet nozzle 202 passed immediately above the center of the bonded substrate stack 101, the jet pressure was raised at a rate of 100 kgf/cm$^2$ per cm of the moving distance of the jet nozzle 202.

After the jet nozzle 202 passed a position 60 mm from a portion immediately above the center of the bonded substrate stack 101, the jet pressure was fixed at 2,200 kgf/cm$^2$.

An elastic member 206 (e.g., Viton, perfluoro rubber, or silicone rubber) is preferably placed at the contact portion between the substrate holding portion 205 and the bonded substrate stack 101. In this case, since the bonded substrate stack 101 separated into two substrates can be easily spaced apart from each other, the jet can be easily injected against the bonded substrate stack 101 supported by the substrate holding portions 205.

With the above process, the bonded substrate stack 101 was separated into two substrates at the porous layer as a separation layer.

Various methods can be employed to hold the bonded substrate stack 101. For example, the bonded substrate stack 101 may be held from both sides or held by a substrate holding portion with a vacuum chuck. In the latter case, the bonded substrate stack 101 may be pulled to both sides and held. With this arrangement, the two substrates which are physically separated are immediately split, so damage due to friction between the two substrates can be prevented.

As a result, in addition to the SiO$_2$ layer and epitaxial Si layer formed on the surface of the first substrate, part of the porous Si layer was transferred to the second substrate side. The porous Si layer was left on the surface of the first substrate.

When 100 bonded substrate stacks were separated by this method, about 90% of them were satisfactorily separated. On the other hand, when bonded substrate stacks were separated while maintaining a predetermined jet pressure, about 30% of bonded substrate stacks were damaged during processing.

The porous Si layer transferred to the second substrate was selectively etched under stirring in a mixed solution of 49% hydrofluoric acid and 30% hydrogen peroxide (corresponding to the step shown in FIG. 1E). The single-crystal Si layer of the second substrate served as an etch stop layer. The porous Si layer was selectively etched and completely removed.

The etching rate of the non-porous Si single crystal for the above etchant is very low. The selectivity ratio to the etching rate of the porous layer is 105 or more. The etching amount of the non-porous layer (about several ten Å) is allowable for practical use.

With the above process, an SOI substrate having a 0.2-$\mu$m thick single-crystal Si layer on the Si oxide film was formed. The thickness of the single-crystal Si layer after the porous Si layer was selectively etched was measured at 100 points on the entire surface. The thickness was 201 nm+4 nm.

Section observation with a transmission electron microscope revealed that no new crystal defects were formed in the single-crystal Si layer, and satisfactory crystallinity was maintained.

The resultant structure was subjected to a heat treatment in hydrogen at 1,100° C. for 1 hr, and the surface roughness was evaluated with an atomic force microscope. The mean square roughness in a 50-$\mu$m square area was about 0.2 nm. This almost equals that of a commercially available Si wafer.

The same result as described above was obtained even when the oxide film (SiO$_2$) was formed not on the surface of the epitaxial layer but on the surface of the second substrate or on both surfaces.

The porous Si layer left on the first substrate side was selectively etched under stirring in a mixed solution of water, 40% hydrofluoric acid, and 30% hydrogen peroxide. When the resultant structure was subjected to a surface treatment such as hydrogen annealing or surface polishing, the substrate could be recycled as the first or second substrate.

In the above example, one bonded substrate stack was processed. However, when a plurality of bonded substrate stacks are aligned along the planar direction, and the jet nozzle of the separating apparatus is scanned in the planar direction, the plurality of bonded substrate stacks can be separated at once.

Alternatively, when a plurality of bonded substrate stacks are aligned in the axial direction, and a mechanism for scanning the jet nozzle of the separating apparatus in the axial direction is used, the plurality of bonded substrate stacks can be sequentially separated.

In the above example, the jet nozzle was scanned. Instead, the bonded substrate stack may be scanned while the jet nozzle is fixed in position.

In the above example, the separating apparatus 200 shown in FIG. 14 was used. The separating apparatus 100 shown in FIG. 3 or the separating apparatus 400 shown in FIG. 13 may be used.

EXAMPLE 2

A first p- or n-type single-crystal Si substrate having a resistivity of 0.01 Ω·cm was subjected to two-step anodizing in an HF solution to form two porous layers (step shown in FIG. 1A). The anodizing conditions were as follows.

<Anodizing of First Step>

Current density: 7 (mA/cm$^2$)

Anodizing solution: $HF:H_2O:C_2H_5OH=1:1:1$

Time: 10 (min)

Thickness of first porous Si: 4.5 ($\mu$m)

<Anodizing of Second Step>

Current density: 20 (mA/cm$^2$)

Anodizing solution: $HF:H_2O:C_2H_5OH=1:1:1$

Time: 2 (min)

Thickness of second porous Si: 2 ($\mu$m)

A porous Si layer having a two-layered structure was formed. The surface porous Si layer anodized at a low current first was used to form a high-quality epitaxial Si layer, and the lower porous Si layer (layer with high porosity) anodized at a high current was used as a separation layer, so the functions of the two layers were separated. The thickness of the porous Si layer formed at a low current is not limited to the above thickness (4.5 $\mu$m) and is suitably several hundred to 0.1 $\mu$m. The thickness of the porous Si layer formed at a high current is also not limited to the above thickness (2 $\mu$m) as far as a thickness at which the bonded substrate stack can be separated by jet is ensured.

After formation of the second porous Si layer, a third layer or more layers having different porosities may be formed.

This substrate was oxidized in an oxygen atmosphere at 400° C. for 1 hr. Upon oxidation, the inner wall of each pore of the porous Si layer was covered with a thermal oxide film. The surface of the porous Si layer was treated with hydrofluoric acid to remove only the oxide film on the surface of the porous Si layer while leaving the oxide film on the inner wall of each pore. After this, single-crystal Si was epitaxially grown on the porous Si layer to 0.3 $\mu$m by CVD (Chemical Vapor Deposition). The growing conditions were as follows.

Source gas: $SiH_2Cl_2/H_2$

Gas flow rate: 0.5/180 (1/min)

Gas pressure: 80 (Torr)

Temperature: 900 (° C.)

Growth rate: 0.3 ($\mu$m/min)

As an insulating layer, an oxide film ($SiO_2$ layer) having a thickness of 200 nm was formed on the surface of the epitaxial Si layer by thermal oxidation (corresponding to the step shown in FIG. 1B).

The first substrate and a second Si substrate which was independently prepared were stacked such that the surface of the $SiO_2$ layer opposed the surface of the second substrate. The resultant structure was subjected to a heat treatment at 1,100° C. for 1 hr to bond the two substrates (corresponding to the step shown in FIG. 1C).

Next, the resultant bonded substrate stack 101 was separated using the separating apparatus 400 shown in FIG. 13 (corresponding to the step shown in FIG. 1D). Details will be described below.

First, the bonded substrate stack 101 was held vertically between the substrate holding portions 404 and 406, and the piston rod 410 was pushed to bring the substrate holding portion 406 into contact with the bonded substrate stack 101. In this state, the vacuum chucks of the substrate holding portions 404 and 406 were actuated. The distance between the bonded substrate stack 101 and the jet nozzle 418 is preferably 10 to 30 mm. In this example, the distance was set to be 15 mm.

Subsequently, water as a jet medium was sent from the high-pressure pump 419 to the jet nozzle 418, and stabilization of the jet was waited. The jet pressure was set to be 500 kgf/cm$^2$ under the control of the pressure control section 420. When the jet stabilized, the shutter 415 was opened to inject the jet against the concave portion of the bevelling of the bonded substrate stack 101. At this time, the substrate holding portion 404 was rotated by the motor 402 to rotate the bonded substrate stack 101.

Separation processing was performed by controlling the high-pressure pump 419 in accordance with the procedure shown in FIG. 9. First, separation processing was started while maintaining the jet pressure at 500 kgf/cm$^2$. For a period of 20 to 80 sec after the start of separation processing, separation processing was continued while maintaining the jet pressure at 200 kgf/cm$^2$. For a period of 80 to 100 sec after the start of separation processing, the unseparated portion was separated at a higher jet pressure of 400 kgf/cm$^2$.

With the above processing, the bonded substrate stack 101 was separated into two substrates by an appropriate separation force without being damaged.

According to the separating apparatus 400, since the two substrates separated from the bonded substrate stack 101 are immediately split from each other, the two substrates after separation are unlikely to be damaged due to friction.

Although the method of separating the bonded substrate stack without rotating it but instead scanning the jet nozzle, as in the separating apparatus 200 shown in FIG. 14, is effective, the bonded substrate stack can be separated using a low-pressure jet when the bonded substrate stack 101 is separated while being rotated, as in the separating apparatus 400 shown in FIG. 13. For example, when the separating apparatus 200 shown in FIG. 14 uses a jet nozzle 202 having a diameter of 0.15 mm, a jet having a pressure in the neighborhood of 2,000 kgf/cm$^2$ is required. However, in the separating apparatus 400 shown in FIG. 13, the bonded substrate stack can be separated using a jet having a pressure of several hundred kgf/cm$^2$. This is because when the jet is injected against the central portion of the bonded substrate stack 101, the separation force efficiently acts on the internal portion of the bonded substrate stack 101.

The following effects can be obtained by reducing the jet pressure.

1) Break or damage to the bonded substrate stack can be prevented.

2) Since the high-pressure pump has sufficient capability, a plurality of jet nozzles can be simultaneously used.

3) The high-pressure pump can be made compact and lightweight.
4) Since the degree of freedom in selection of the material of the high-pressure pump or pipe system increases, a material suitable for the type of jet medium (e.g., pure water) can be selected.
5) Since the noise of high-pressure pump or jet ejection decreases, soundproofing measures can be easily taken.

In the separating apparatus 400 shown in FIG. 13, only the substrate holding portion 404 side is driven, so a twisting force may act on the bonded substrate stack 101. If this force poses a problem, another motor is preferably coupled to the substrate holding portion 406 side to drive the substrate holding portions 404 and 406 in synchronism with each other.

After the bonded substrate stack 101 was separated, the porous Si layer transferred to the second substrate was selectively etched under stirring in a mixed solution of 49% hydrofluoric acid and 30% hydrogen peroxide (corresponding to the step shown in FIG. 1E). The single-crystal Si layer served as an etch stop layer. The porous Si layer was selectively etched and completely removed.

The etching rate of the non-porous Si single crystal for the above etchant is very low. The selectivity ratio to the etching rate of the porous layer is $10^5$ or more. The etching amount of the non-porous layer (about several ten Å) is allowable for practical use.

With the above process, an SOI substrate having a 0.2-$\mu$m thick single-crystal Si layer on the Si oxide film was formed. The thickness of the single-crystal Si layer after the porous Si layer was selectively etched was measured at 100 points on the entire surface. The thickness was 201 nm±4 nm.

Section observation with a transmission electron microscope revealed that no new crystal defects were formed in the single-crystal Si layer, and satisfactory crystallinity was maintained.

The resultant structure was subjected to a heat treatment in hydrogen at 1,100° C. for 1 hr, and the surface roughness was evaluated with an atomic force microscope. The mean square roughness in a 50-$\mu$m square area was about 0.2 nm. This almost equals that of a commercially available Si wafer.

The same result as described above was obtained even when the oxide film ($SiO_2$) was formed not on the surface of the epitaxial layer but on the surface of the second substrate or on both surfaces.

The porous Si layer left on the first substrate side was selectively etched under stirring in a mixed solution of water, 40% hydrofluoric acid, and 30% hydrogen peroxide. When the resultant structure was subjected to a surface treatment such as hydrogen annealing or surface polishing, the substrate could be recycled as the first or second substrate.

Even when the separating apparatus 100 shown in FIG. 3 was used as a separating apparatus, the same effects as described above were obtained.

Even when the separating apparatus 200 shown in FIG. 14 was employed, a satisfactory substrate was manufactured.

EXAMPLE 3

An oxide film ($SiO_2$ layer) having a thickness of 400 nm was formed on the surface of a first single-crystal Si substrate by thermal oxidation as an insulating layer. Next, ions were implanted from the surface of the first substrate such that the projection range stayed in the Si substrate.

With this process, a layer serving as a separation layer was formed as a distortion layer due to a microcavity layer or heavily doped ion species layer at a depth corresponding to the projection range.

The first substrate and a second Si substrate which was independently prepared were brought into contact such that the surface of the $SiO_2$ layer opposed the surface of the second substrate. The resultant structure was subjected to a heat treatment at 600° C. for 10 hrs to bond the two substrates. Before the two substrates were bonded, the substrates were treated by $N_2$ plasma or the like to increase the bonding strength.

The resultant bonded substrate stack 101 was separated using the separating apparatus 400 shown in FIG. 13. Separation processing was executed under the same conditions as those in Example 2 except that the jet pressure was raised by about 150 kgf/cm² throughout processing.

As a result, in addition to the $SiO_2$ layer and surface single-crystal layer which were formed on the surface of the first substrate to have a thickness of about 500 nm, part of the separation layer was transferred to the second substrate side. The separation layer was left on the surface of the first substrate.

The separation surface of the separated second substrate was polished by about 300 nm by a CMP (Chemical Mechanical Polishing) apparatus to remove the damage layer formed upon ion implantation and separation processing and was planarized.

With the above process, an SOI substrate having a 0.2-$\mu$m thick single-crystal Si layer on the Si oxide film was formed. The thickness of the single-crystal Si layer was measured at 100 points on the entire surface. The thickness was 201 nm±4 nm.

The resultant structure was subjected to a heat treatment in hydrogen at 1,100° C. for 1 hr, and the surface roughness was evaluated with an atomic force microscope. The mean square roughness in a 50-$\mu$m square area was about 0.3 nm. This almost equals that of a commercially available Si wafer.

In this example, the surface region of the single-crystal Si substrate (first substrate) is transferred to the second substrate via the separation layer formed by ion implantation. Alternatively, an epitaxial wafer may be used. A separation layer is formed at the lower portion of the epitaxial layer by ion implantation, and the epitaxial layer is transferred to the second substrate by separating the substrate at the separation layer.

In the above example, after formation of the separation layer by ion implantation, the $SiO_2$ layer on the surface of the first substrate may be removed. After an epitaxial layer and an $SiO_2$ layer are formed, the first substrate is bonded to the second substrate, and the substrate is separated at the separation layer, thereby transferring the epitaxial layer and $SiO_2$ layer to the second substrate.

Even when the separating apparatus 100 shown in FIG. 3 was used as a separating apparatus, the same effects as described above were obtained.

Even when the separating apparatus 200 shown in FIG. 14 was employed, a satisfactory substrate was manufactured.

EXAMPLE 4

An SOI substrate was manufactured by the same method as in Example 2 except that separation processing was executed while scanning the jet nozzle on the separation region of the bonded substrate stack.

A substrate 101 formed by the same method as in Example 2 was separated using the separating apparatus shown in FIG. 3. Details will be described below.

The bonded substrate stack 101 was vertically held between the substrate holding portions 108 and 109 while being pressed by the substrate holding portion 109. The distance between the bonded substrate stack 101 and the jet nozzle 112 is preferably 10 to 30 mm. In this example, the distance was set to be 15 mm.

In this example, the jet pressure was controlled on the basis of the control example shown in FIG. 10. First, the jet nozzle 112 was retreated to a position where the jet ejected from the jet nozzle 112 did not hit the bonded substrate stack 101 (the jet nozzle 112 may be retreated in advance). A jet medium was sent from the high-pressure pump 115 to the jet nozzle 112 to eject a jet from the jet nozzle 112, and at the same time, scanning of the jet nozzle 112 was started (section Y1). In the section Y1, the jet pressure was raised to 500 kgf/cm$^2$.

In the section Y2, the peripheral portion of the bonded substrate stack 101 was mainly separated while maintaining the jet pressure at 500 kgf/cm$^2$. By separating the peripheral portion of the bonded substrate stack 101 using a high-pressure jet, the separation force can be efficiently applied to the bonded substrate stack 101.

In this example, the section Y3 was set for 10 to 90 mm from the edge portion of the bonded substrate stack 101, i.e., the portion where separation was started (to be referred to as a separation start position). In the section Y3, the jet pressure was set to be 200 kgf/cm$^2$. By setting the jet pressure to be relatively low in the section Y3, damage to the bonded substrate stack 101 can be prevented.

Also, in this example, the section Y4 was set for 90 to 100 mm from the separation start position of the bonded substrate stack 101. In this section, the jet pressure was raised to 400 kgf/cm$^2$ to separate the unseparated portion. When the jet pressure is raised in separating the central portion of the bonded substrate stack 101, an appropriate separation force can be applied to the internal portion of the bonded substrate stack 101. For this reason, the bonded preventing damage to it.

In the section Y5, the jet pressure was gradually reduced.

Even when the separating apparatus 400 shown in FIG. 13 was used as a separating apparatus, the same effects as described above were obtained.

Even when the separating apparatus 200 shown in FIG. 14 was employed, a satisfactory substrate was manufactured.

EXAMPLE 5

This example is the same as in Example 4 except that the jet pressure was controlled on the basis of the control example shown in FIG. 11.

The bonded substrate stack 101 formed by the same method as in Example 2 was vertically supported between the substrate holding portions 108 and 109 while being pressed by the substrate holding portion 109. The distance between the bonded substrate stack 101 and the jet nozzle 112 is preferably 10 to 30 mm. In this example, the distance was set to be 15 mm.

In this example, the jet pressure was controlled on the basis of the control example shown in FIG. 11. First, the jet nozzle 112 was retreated to a position where the jet ejected from the jet nozzle 112 did not hit the bonded substrate stack 101 (the jet nozzle 112 may be retreated in advance). A jet medium was sent from the high-pressure pump 115 to the jet nozzle 112 to eject a jet from the jet nozzle 112, and at the same time, scanning of the jet nozzle 112 was started (section Y1). In the section Y1, the jet pressure was raised to 500 kgf/cm$^2$.

In the section Y2, the peripheral portion of the bonded substrate stack 101 was mainly separated while maintaining the jet pressure at 500 kgf/cm$^2$. By separating the peripheral portion of the bonded substrate stack 101 using a high-pressure jet, the separation force can be efficiently applied to the bonded substrate stack 101.

In this example, the section Y3 was set for 10 to 60 mm from the separation start position of the bonded substrate stack 101. In the section Y3, separation processing was executed while reducing the jet pressure from 500 kgf/cm$^2$ to 200 kgf/cm$^2$ By separating the bonded substrate stack while gradually reducing the jet pressure in the section Y3, damage to the stack can be prevented.

In this example, the section Y4 was set for 60 to 90 mm from the separation start position, and separation processing was executed while gradually raising the jet pressure to 400 kgf/cm$^2$. The reason why the jet pressure is gradually raised in the section Y4 is as follows. As the separation region comes close to the central portion of the bonded substrate stack 101, the discharge paths of the jet medium injected into the bonded substrate stack 101 increase, and accordingly, the separation force acting on the internal portion of the bonded substrate stack 101 weakens. To efficiently perform separation processing, the separation force must be compensated.

In this example, the section Y5 was set for 90 to 100 mm from the separation start position of the bonded substrate stack 101. In this section, the unseparated portion was separated while raising the jet pressure to 400 kgf/cm$^2$. When the jet pressure is raised in separating the central portion of the bonded substrate stack 101, an appropriate separation force can be applied to the internal portion of the bonded substrate stack 101, so the bonded substrate stack 101 can be efficiently separated while preventing damage to it.

In the section Y6, the jet pressure was gradually reduced.

Even when the separating apparatus 400 shown in FIG. 13 was used as a separating apparatus, the same effects as described above were obtained.

Even when the separating apparatus 200 shown in FIG. 14 was employed, a satisfactory substrate was manufactured.

As described above, by appropriately changing the jet pressure in accordance with the progress of separation processing, damage to the object to be separated can be prevented while efficiently performing separation processing.

According to the separating apparatus or method, a high-quality semiconductor substrate can be manufactured at a high yield.

According to the present invention, an object can be efficiently separated and split.

In addition, according to the present invention, a satisfactory semiconductor substrate can be manufactured.

The present invention is not limited to the above embodiments and various changes and modifications can be made within the spirit and scope of the present invention. Therefore, to apprise the public of the scope of the present invention, the following claims are made.

What is claimed is:

1. A separating apparatus for separating an object comprising:

jet means having a fluid jet unit for ejecting a jet of fluid to the object to be separated to separate the object;

control means for changing a condition for ejecting the fluid from the jet unit in accordance with progress of object separation processing; and a holding portion for holding the object,
wherein the object has a plate shape and is formed by bonding a first member to a second member, the first member having a semiconductor layer, and
the holding portion holds the object so that the fluid is injected into the object in a direction that is perpendicular to the axis of the object.

2. The apparatus according to claim 1, wherein said control means changes a pressure of the fluid to be ejected from the jet unit in accordance with progress of object separation processing.

3. The apparatus according to claim 2, wherein said control means controls said jet means to set the pressure of the fluid to be relatively high in separating a vicinity of a peripheral portion of a separation surface of the object to be separated.

4. The apparatus according to claim 2, wherein said control means controls said jet means to set the pressure of the fluid to be relatively high in separating a vicinity of a central portion of a separation surface of the object to be separated.

5. The apparatus according to claim 2, wherein said control means controls said jet means to set the pressure of the fluid to be relatively high in separating vicinities of peripheral and central portions of a separation surface of the object to be separated and controls said jet means to set the pressure of the fluid to be relatively low in separating an intermediate portion between the vicinities of the peripheral and the central portions.

6. The apparatus according to claim 1, wherein said control means changes the condition for ejecting the fluid from the jet unit in accordance with a relative positional relationship between the jet unit and the object to be separated.

7. The apparatus according to claim 1, wherein said control means changes the condition for ejecting the fluid from the jet unit as a function of time.

8. The apparatus according to claim 1 further comprising scanning means for scanning the jet unit.

9. A separating method comprising separating an object using said separating apparatus of claim 1.

10. A separating apparatus for separating an object comprising:
jet means having a fluid jet unit for ejecting a jet of fluid to the object to be separated to separate the object;
control means for changing a condition for ejecting the fluid from the jet unit in accordance with progress of object separation processing; and
rotating means for rotating the object about an axis perpendicular to a separation surface of the object to be separated.

11. A separating method for separating an object by ejecting a jet of fluid from a jet unit to the object to be separated, comprising:
the control step of changing a condition for ejecting the fluid from the jet unit in accordance with progress of object separation processing,
wherein the object is formed by bonding a first member to a second member, the first member having a semiconductor layer.

12. The method according to claim 11, wherein the object to be separated has a plate shape and is separated by injecting the fluid against the object that has the plate shape in a direction that is perpendicular to the axis of the object that has the plate shape.

13. The method according to claim 11, wherein said control step comprises changing a pressure of the fluid to be ejected from the jet unit in accordance with progress of object separation processing.

14. The method according to claim 13, wherein said control step comprises setting the pressure of the fluid to be ejected from the jet unit to be relatively high in separating a vicinity of a peripheral portion of a separation surface of the object to be separated.

15. The method according to claim 13, wherein said control step comprises setting the pressure of the fluid to be ejected from the jet unit to be relatively high in separating a vicinity of a central portion of a separation surface of the object to be separated.

16. The method according to claim 13, wherein said control step comprises setting the pressure of the fluid to be ejected from the jet unit to be relatively high in separating vicinities of peripheral and central portions of a separation surface of the object to be separated and setting the pressure of the fluid to be ejected from the jet unit to be relatively low in separating an intermediate portion between the vicinities of the peripheral and the central portions.

17. The method according to claim 11, wherein said control step comprises changing the condition for ejecting the fluid from the jet unit in accordance with a relative positional relationship between the jet unit and the object to be separated.

18. The method according to claim 11, wherein said control step comprises changing the condition for ejecting the fluid from the jet unit as a function of time.

19. The method according to claim 11, further comprising executing separation processing for the object while scanning the jet unit along the separation surface of the object to be separated.

20. A separating method of separating an object by ejecting a jet of fluid from a jet unit to the object to be separated, comprising:
the control step of changing a condition for ejecting the fluid from the jet unit in accordance with progress of object separation processing; and
the step of executing separation processing for the object while rotating the object about an axis perpendicular to the separation surface of the object to be separated.

21. A separating method of separating an object by ejecting a jet of fluid from a jet unit to the object to be separated, comprising:
the control step of changing a condition for ejecting the fluid from the jet unit in accordance with progress of object separation processing; and
wherein the object to be separated has a fragile layer as a separation layer.

22. The method according to claim 21, wherein the fragile layer is a porous layer.

23. The method according to claim 21, wherein the fragile layer is a layer having a microcavity.

24. A method of manufacturing a semiconductor substrate, comprising the steps of:
preparing a substrate having a separation layer; and
separating the object at the separation layer using a separating method of separating an object by ejecting a jet of fluid from a jet unit to the object to be separated, comprising:
the control step of changing a condition for ejecting the fluid from the jet unit in accordance with progress of object separation processing.

25. A semiconductor substrate separating apparatus for separating an object having a fragile layer as a separation layer, said apparatus comprising:

jet means having a fluid jet unit for ejecting a jet of fluid to the object to separate the object;

scanning means for changing a relative positional relationship between the fluid jet unit and the object so that object separation processing progresses from a peripheral portion of the object to a central portion of the object; and control means for changing a pressure of the fluid ejected from the jet unit in accordance with the progress of the object separation processing.

26. A semiconductor substrate separating method of separating an object having a fragile layer as a separation layer by ejecting a jet of fluid from a jet unit to the object, the method comprising:

the control step of changing a pressure of the fluid ejected from the jet unit in accordance with progress of object separation processing, wherein the object separation processing progresses from a peripheral portion of the object to a central portion of the object.

27. A semiconductor substrate method of manufacturing a semiconductor substrate, comprising the steps of:

forming a first substrate in which a porous layer and a non-porous layer are sequentially formed on one surface;

bonding the first substrate to a second substrate via the non-porous layer to form a bonded substrate stack; and separating the bonded substrate stack into two substrates while ejecting a jet of fluid to the porous layer of the bonded substrate stack, wherein the separation step comprises changing a pressure of the fluid in accordance with progress of the separation step, wherein the separation step progresses from a peripheral portion of the bonded substrate stack to a central portion of the bonded substrate stack.

28. A method of manufacturing a semiconductor substrate, comprising the steps of:

implanting ions from a surface of a substrate consisting of a single-crystal semiconductor to a predetermined depth, thereby forming a first substrate in which a microcavity layer is formed;

bonding a second substrate to a front surface side of the first substrate to form a bonded substrate stack; and separating the bonded substrate stack into two substrates while ejecting a jet of fluid to the microcavity layer of the bonded substrate stack, wherein the separation step comprises changing a pressure of the fluid in accordance with progress of the separation step, wherein the separation step progresses from a peripheral portion of the bonded substrate stack to a central portion of the bonded substrate stack.

29. A separating apparatus comprising:

pressure applying means for applying a pressure of a fluid to a side surface of a composite member which is formed by bonding a plurality of members and has a separation layer formed by anodizing or ion implantation;

rotating means for rotating the composite member about an axis perpendicular to the separation layer of the composite member;

scanning means for changing a portion of the composite member to which the pressure is applied so that separation processing of the composite member progresses from a peripheral portion of the composite member to a central portion of the composite member; and control means for controlling said pressure applying means to change the pressure applied to the side surface of the composite member in accordance with progress of the separation processing of the composite member.

30. A method of manufacturing a semiconductor substrate comprising:

a step of separating a composite member by applying a pressure of a fluid to a side surface of the composite member, the composite member being formed by bonding a plurality of members and has a separation layer formed by anodizing or ion implantation, while rotating the composite member about an axis perpendicular to the separation layer of the composite member, wherein the step of separating includes controlling the pressure applied to the side surface of the composite member in accordance with progress of a separation processing of the composite member, wherein the step of separating progresses from a peripheral portion of the composite member to a central portion of the composite member.

* * * * *

UNITED STATES PATENT AND TRADEMARK OFFICE
CERTIFICATE OF CORRECTION

PATENT NO.   : 6,436,226 B1
DATED        : August 20, 2002
INVENTOR(S)  : Kazuaki Omi et al.

It is certified that error appears in the above-identified patent and that said Letters Patent is hereby corrected as shown below:

<u>Title page,</u>
Item [56], References Cited, U.S. PATENT DOCUMENTS,
"5,212,451 A    5/1993           Frank et al." should read
-- 5,213,451 A    5/1993           Frank et al. --

<u>Column 1,</u>
Line 24, "capacicance" should read -- capacitance --

<u>Column 8,</u>
Line 22, "driving of he" should read -- driving of the --

<u>Column 9,</u>
Line 47, "to aretreat positiom" should read -- to a retreat position --

<u>Column 11,</u>
Line 65, "pressur[0085] of" should read -- pressure of --

<u>Column 16,</u>
Line 38, "is 105 or" should read -- is $10^5$ or --
Line 45, "201 nm+4 nm." should read -- 201 nm $\pm$ 4 nm. --

<u>Column 19, line 67 to Column 20, line 1,</u>
"layer or heavily" should read -- layer or a heavily --

UNITED STATES PATENT AND TRADEMARK OFFICE
CERTIFICATE OF CORRECTION

PATENT NO.   : 6,436,226 B1
DATED        : August 20, 2002
INVENTOR(S)  : Kazuaki Omi et al.

It is certified that error appears in the above-identified patent and that said Letters Patent is hereby corrected as shown below:

Column 21,
Lines 37-38, "For this reason, the bonded preventing damage to it." should read
-- For this reason, the bonded substrate stack 101 can be efficiently separated while preventing damage to it. --

Signed and Sealed this

Seventh Day of January, 2003

JAMES E. ROGAN
*Director of the United States Patent and Trademark Office*